(12) United States Patent
Yoon et al.

(10) Patent No.: US 11,079,794 B2
(45) Date of Patent: Aug. 3, 2021

(54) ELECTRONIC DEVICE AND METHOD OF CONTROLLING OPERATION OF ELECTRONIC DEVICE

(71) Applicant: Samsung Electronics Co., Ltd., Suwon-si (KR)

(72) Inventors: Chiwoong Yoon, Seongnam-si (KR); Hyungjin Park, Yongin-si (KR); Daeseok Kim, Suwon-si (KR); Jungeun Jang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/999,430

(22) PCT Filed: Jan. 23, 2017

(86) PCT No.: PCT/KR2017/000777
§ 371 (c)(1),
(2) Date: Aug. 17, 2018

(87) PCT Pub. No.: WO2017/142225
PCT Pub. Date: Aug. 24, 2017

(65) Prior Publication Data
US 2019/0278324 A1    Sep. 12, 2019

(30) Foreign Application Priority Data
Feb. 17, 2016 (KR) .................. 10-2016-0018736

(51) Int. Cl.
*G06F 1/16* (2006.01)
*G06F 1/20* (2006.01)
(Continued)

(52) U.S. Cl.
CPC .............. *G06F 1/1616* (2013.01); *G06F 1/16* (2013.01); *G06F 1/1688* (2013.01); *G06F 1/20* (2013.01);
(Continued)

(58) Field of Classification Search
None
See application file for complete search history.

(56) References Cited

U.S. PATENT DOCUMENTS 6,266,241 B1   7/2001   Van Brocklin et al.
9,104,371 B2   8/2015   Sartee et al.
(Continued)

FOREIGN PATENT DOCUMENTS

CN     102759949 A    10/2012
CN     102854980 A     1/2013
(Continued)

OTHER PUBLICATIONS

ISA/KR, "International Search Report," International Application No. PCT/KR2017/000777, Apr. 24, 2017, 7 pages.
(Continued)

*Primary Examiner* — Courtney L Smith

(57) ABSTRACT

An electronic device according to various embodiments of the present invention may comprise: at least one sensor; a processor electrically connected to the at least one sensor; a memory electrically connected to the processor; and a support structure formed to have one end connected to a boundary between a first region and a second region of a rear surface of the electronic device and rotate in one direction with reference to the one end so as to cover the second region in a closed state thereof and support the electronic device in an opened state thereof. The memory may comprise instructions which, when executed, enable the processor to detect the opened support structure by using the at (Continued)

least one sensor, to detect a movement of the electronic device by using the at least one sensor in a state where the support structure is opened, and to detect an inclination of the electronic device with respect to a reference surface by using the at least one sensor and control an operation of the electronic device at least partially on the basis of the inclination when the movement of the electronic device has a value equal to or smaller than a predetermined threshold value for a predetermined time or longer. Besides, various embodiments are possible.

17 Claims, 22 Drawing Sheets

(51) Int. Cl.

| | | |
|---|---|---|
| G06F 3/14 | (2006.01) | |
| G06F 3/16 | (2006.01) | |
| H04R 3/00 | (2006.01) | |
| H04R 29/00 | (2006.01) | |
| H05K 7/20 | (2006.01) | |
| G06F 3/01 | (2006.01) | |

(52) U.S. Cl.
CPC ............... *G06F 1/206* (2013.01); *G06F 3/01* (2013.01); *G06F 3/14* (2013.01); *G06F 3/16* (2013.01); *G06F 3/165* (2013.01); *H04R 3/00* (2013.01); *H04R 29/001* (2013.01); *H05K 7/20172* (2013.01); *H05K 7/20209* (2013.01); *G06F 1/203* (2013.01)

(56) References Cited

U.S. PATENT DOCUMENTS

| | | | |
|---|---|---|---|
| 9,116,550 B2 | 8/2015 | Siddiqui et al. | |
| 9,389,647 B2* | 7/2016 | Hwang | ................ G06F 1/1681 |
| 2003/0132921 A1 | 7/2003 | Torunoglu et al. | |
| 2010/0026630 A1 | 2/2010 | Kuribayashi | |
| 2012/0278638 A1 | 11/2012 | Wang et al. | |
| 2013/0083953 A1 | 4/2013 | Chang | |
| 2013/0128432 A1 | 5/2013 | Lee et al. | |
| 2013/0150120 A1 | 6/2013 | Wu et al. | |
| 2014/0043259 A1* | 2/2014 | Park | ....................... G06F 3/0412 |
| | | | 345/173 |
| 2014/0133689 A1 | 5/2014 | Yu | |
| 2014/0274217 A1 | 9/2014 | Lee et al. | |
| 2014/0298062 A1* | 10/2014 | Lee | ......................... G01R 33/07 |
| | | | 713/323 |
| 2014/0361932 A1 | 12/2014 | Irci et al. | |
| 2015/0055284 A1 | 2/2015 | Han | |
| 2015/0163940 A1* | 6/2015 | Scott | ...................... G06F 1/1656 |
| | | | 361/679.01 |
| 2015/0185866 A1 | 7/2015 | Im | |
| 2015/0324008 A1 | 11/2015 | Yeo | |
| 2015/0335115 A1* | 11/2015 | Kim | ....................... A45C 11/00 |
| | | | 224/191 |
| 2016/0054759 A1* | 2/2016 | Lee | ....................... G06F 1/1656 |
| | | | 361/679.28 |
| 2016/0179132 A1* | 6/2016 | Harr | ........................ G06F 1/163 |
| | | | 361/679.03 |
| 2017/0054971 A1* | 2/2017 | Jiao | .......................... G06F 3/167 |
| 2019/0278324 A1 | 9/2019 | Yoon et al. | |

FOREIGN PATENT DOCUMENTS

| | | |
|---|---|---|
| CN | 104049744 A | 9/2014 |
| CN | 104238662 A | 12/2014 |
| CN | 108700943 A | 10/2018 |
| EP | 1484663 A2 | 12/2004 |
| EP | 3404511 A1 | 11/2018 |
| KR | 10-2008-0067231 A | 7/2008 |
| KR | 10-2010-0005054 A | 1/2010 |
| KR | 10-1463524 B1 | 11/2014 |
| KR | 10-2015-0022614 A | 3/2015 |
| KR | 10-2015-0077667 A | 7/2015 |
| TW | 201106128 A | 2/2011 |

OTHER PUBLICATIONS

Office Action dated Oct. 9, 2020 in connection with Chinese Patent Application No. 201780012079.1, 30 pages.
Notification of Due Registration Formalities dated Jun. 1, 2021 in connection with Chinese Application No. 201780012079.1, 8 pages.

* cited by examiner

FIG. 19
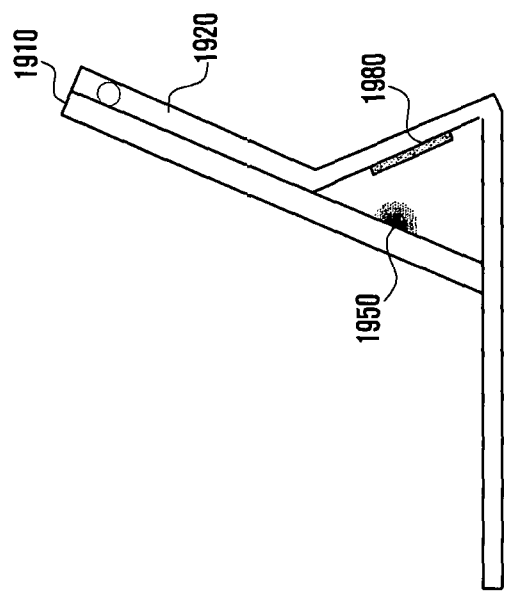
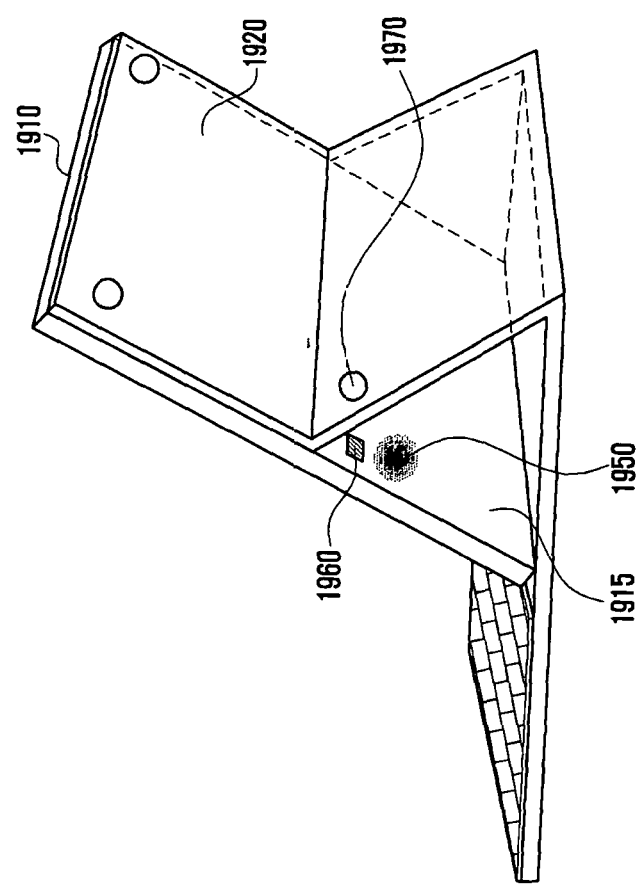

ELECTRONIC DEVICE AND METHOD OF CONTROLLING OPERATION OF ELECTRONIC DEVICE

CROSS-REFERENCE TO RELATED APPLICATIONS AND CLAIM OF PRIORITY

This application is a 371 National Stage of International Application No. PCT/KR2017/000777 filed Jan. 23, 2017, which claims priority to Korean Patent Application No. 10-2016-0018736 filed on Feb. 17, 2016, the disclosures of which are herein incorporated by reference in their entirety.

BACKGROUND

1. Field

Various embodiments of the present invention relate to an electronic device for detecting a space formed upon supporting the electronic device and for controlling a detection operation and a method of controlling the electronic device.

2. Description of Related Art

Nowadays, various electronic devices such as a smart phone, tablet personal computer (PC), portable multimedia player (PMP), personal digital assistant (PDA), laptop PC, and wearable device may provide various functions (e.g., social network service (SNS), Internet searching, multimedia viewing, or picture or moving picture photographing and execution, or document work) as well as a phone call function.

Users may perform various works at any time and place using a portable electronic device. Further, as the electronic device provides various functions, there is an increase in the cases in which users continuously use the electronic device for a long time. Accordingly, some recent electronic devices may have support structures for supporting the electronic device in a predetermined posture. Further, peripheral devices that may support the electronic device have become widespread.

SUMMARY

Various embodiments of the present invention provide an electronic device that can detect a space formed between the electronic device and a support structure upon the support structure supporting the electronic device and that can control an operation based on the detected space and a method of controlling an operation thereof.

An electronic device according to various embodiments of the present invention includes at least one sensor, a processor electrically connected to the at least one sensor, a memory electrically connected to the processor, and a support structure having one end connected to a boundary of a first area and a second area of a rear surface of the electronic device and configured to cover the second area in a closed state by rotating in one direction based on the one end and configured to support the electronic device in an open state. When executed, the memory stores instructions that enable the processor to detect that the support structure is open using the at least one sensor; to detect a movement of the electronic device using the at least one sensor in a state in which the support structure is open; to detect a slope to a reference surface of the electronic device using the at least one sensor, when the movement of the electronic device is less than a predetermined threshold value for a predetermined time or more; and to control an operation of the electronic device based on at least a portion of the slope.

An electronic device according to various embodiments of the present invention includes at least one sensor; a processor electrically connected to the at least one sensor; a memory electrically connected to the processor; and a case including a first cover corresponding to a front surface of the electronic device, a second cover corresponding to a second area of a rear surface of the electronic device, and a third cover corresponding to a first area of a rear surface of the electronic device and in which at least a portion of the second cover is separated from the second area while forming a predetermined angle from the second area to support the electronic device in a state in which the first cover is attached to the first area. When executed, the memory stores instructions that enable the processor to detect whether the second cover is attached to a second area of a rear surface of the electronic device; to detect a movement of the electronic device using the at least one sensor, when the second cover is separated from the electronic device; to detect a slope to a reference surface of the electronic device using the at least one sensor, when a movement of the electronic device is less than a predetermined reference value for a predetermined time or more; and to control an operation of the electronic device based on at least a portion of the slope.

A method of controlling an operation of an electronic device including a support structure according to various embodiments of the present invention includes detecting whether the support structure is separated by a predetermined gap or more from a rear surface of the electronic device; detecting, if the support structure is separated by a predetermined gap or more from a rear surface of the electronic device, a movement of the electronic device; detecting, when a movement of the electronic device is less than a predetermined threshold value for a predetermined time or more, a slope to a reference surface of the electronic device; and controlling a function of the electronic device based on at least a portion of the slope.

An electronic device and a method of operating the same according to various embodiments of the present invention can detect that the electronic device is supported and control an operation thereof based on a slope to a reference surface of the electronic device.

An electronic device and a method of operating the same according to various embodiments of the present invention can detect, when the electronic device is supported, a space formed between a rear surface and a support structure of the electronic device and control an operation thereof based on the formed space.

An electronic device and a method of operating the same according to various embodiments of the present invention can provide, when the electronic device is supported, various functions using a space formed between a rear surface and a support structure of the electronic device.

An electronic device and a method of operating the same according to various embodiments of the present invention can amplify, when the electronic device is supported, a sound using a space formed between a rear surface and a support structure of the electronic device, reflect particular light to a peripheral area, or emit heat generated therein.

BRIEF DESCRIPTION OF THE DRAWINGS

FIG. 19 is a diagram illustrating an operation of an electronic device according to various embodiments of the present invention.

SUMMARY

Figure 1:
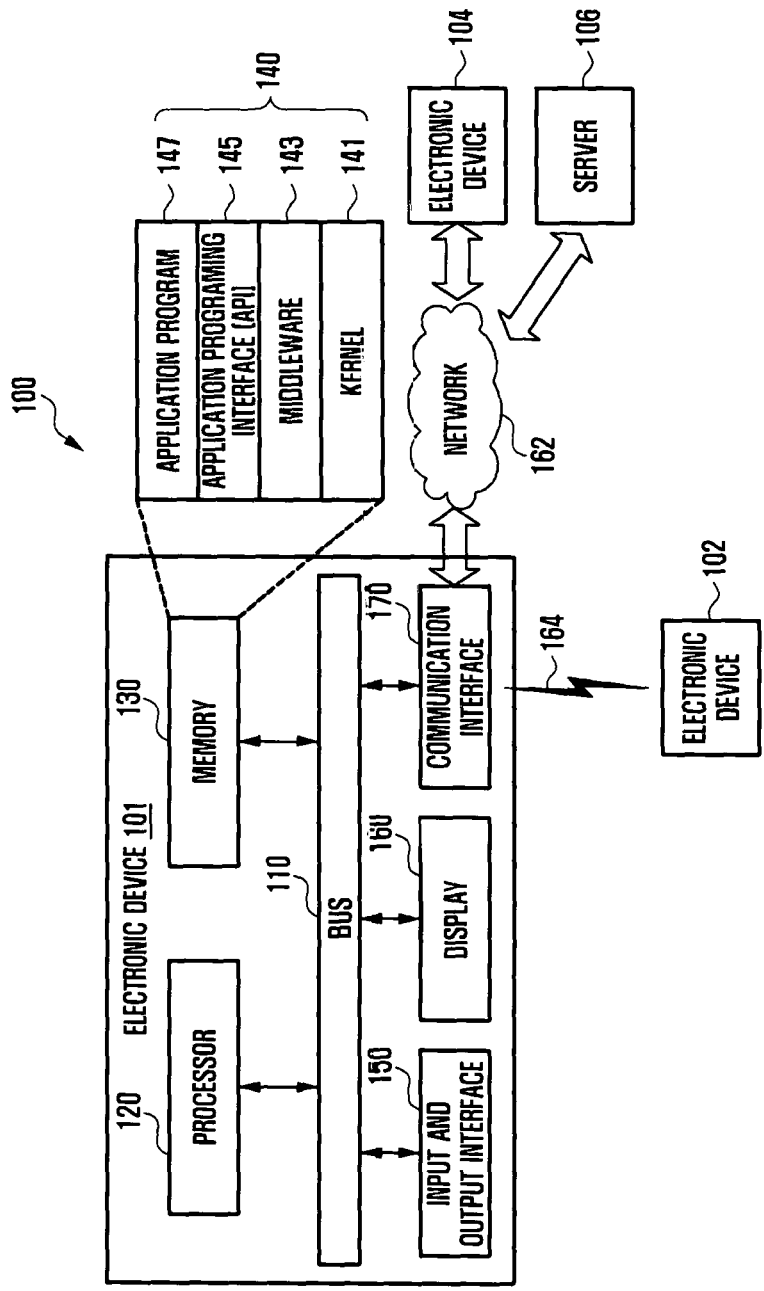
FIG. 1 is a block diagram illustrating a configuration of an electronic device in a network environment according to various embodiments of the present invention.

Hereinafter, various embodiments of this document will be described in detail with reference to the accompanying drawings. It should be understood that embodiments and terms used in the embodiments do not limit technology described in this document to a specific embodiment and include various changes, equivalents, and/or replacements of a corresponding embodiment. The same reference numbers are used throughout the drawings to refer to the same or like parts. Unless the context otherwise clearly indicates, words used in the singular include the plural, and the plural includes the singular. In this document, an expression such as "A or B" and "at least one of A or/and B" may include all possible combinations of the together listed items. An expression such as "first" and "second" used in this document may indicate corresponding constituent elements regardless of order and/or importance, and such an expression is used for distinguishing a constituent element from another constituent element and does not limit any corresponding constituent elements. When it is described that a constituent element (e.g., a first constituent element) is "(functionally or communicatively) coupled to" or is "connected to" another constituent element (e.g., a second constituent element), it should be understood that the constituent element may be directly connected to the other constituent element or may be connected to the other constituent element through another constituent element (e.g., a third constituent element).

In this document, "configured to (or set to)" may be interchangeably used in hardware and software with, for example, "appropriate to", "having a capability to", "changed to", "made to", "capable of", or "designed to" according to a situation. In any situation, an expression "device configured to" may mean that the device is "capable of" being configured together with another device or component. For example, a "processor configured to (or set to) perform phrases A, B, and C" may mean an exclusive processor (e.g., an embedded processor) for performing a corresponding operation or a generic-purpose processor (e.g., CPU or application processor) that can perform a corresponding operation by executing at least one software program stored at a memory device.

An electronic device according to various embodiments of this document may include at least one of, for example, a smart phone, tablet PC, mobile phone, video phone, electronic book reader, desktop PC, laptop PC, netbook computer, workstation, server, PDA, portable multimedia player (PMP), MPEG audio layer-3 (MP3) player, medical device, camera, and wearable device. The wearable device may include at least one of an accessory type device (e.g., watch, ring, bracelet, ankle bracelet, necklace, glasses, contact lens), head-supported-device (HMD), textile or clothing integral type device (e.g., electronic clothing), body attachment type device (e.g., skin pad or tattoo), and bio implantable circuit. In an embodiment, the electronic device may include at least one of, for example, a television, digital video disk (DVD) player, audio device, refrigerator, air-conditioner, cleaner, oven, microwave oven, washing machine, air cleaner, set-top box, home automation control panel, security control panel, media box (e.g., Samsung HomeSync™, AppleTV™, or Google TV™), game console (e.g., Xbox™, PlayStation™), electronic dictionary, electronic key, camcorder, and electronic frame.

In another embodiment, the electronic device may include at least one of various medical devices (e.g., various portable medical measurement devices (blood sugar measurement device, heartbeat measurement device, blood pressure measurement device, or body temperature measurement device), magnetic resonance angiography (MRA) device, magnetic resonance imaging (MRI) device, computed tomography (CT) device, scanning machine, and ultrasonic wave device), navigation device, global navigation satellite system (GNSS), event data recorder (EDR), flight data recorder (FDR), vehicle infotainment device, ship electronic equipment (e.g., ship navigation device, gyro compass), avionics, security device, vehicle head unit, industrial or home robot, drone, automatic teller machine (ATM) of a financial institution, point of sales (POS) of store, and Internet of things (e.g., bulb, various sensors, sprinkler, fire alarm, thermostat, street light, toaster, exercise device, hot water tank, heater, boiler). According to an embodiment, the electronic device may include at least one of furniture, a portion of a building/structure or a vehicle, electronic board, electronic signature receiving device, projector, and various measurement devices (e.g., water supply, electricity, gas, or electric wave measurement device). In various embodiments, the electronic device may be flexible or may be two or more combinations of the foregoing various devices. An electronic device according to an embodiment of this document is not limited to the foregoing devices. In this document, a term "user" may indicate a person using an electronic device or a device (e.g., artificial intelligence electronic device) using an electronic device.

With reference to FIG. 1, in various embodiments, an electronic device 101 is disposed in a network environment 100. The electronic device 101 may include a bus 110, processor 120, memory 130, input and output interface 150, display 160, and communication interface 170. In an embodiment, the electronic device 101 may omit at least one of these constituent elements or may additionally have another constituent element. The bus 110 may connect, for example, constituent elements 110-170 to each other and include a circuit that transfers communication (e.g., control message and/or data) between constituent elements. The processor 120 may include at least one of a central processing unit (CPU), application processor (AP), and communication processor (CP). The processor 120 may execute, for example, calculation or data processing of the control and/or communication of at least one another constituent element of the electronic device 101.

The memory 130 may include a volatile memory and/or a nonvolatile memory. The memory 130 may store, for example, a command or data related to at least one other constituent element of the electronic device 101. According to an embodiment, the memory 130 may store software and/or a program 140. The program 140 may include, for example, a kernel 141, middleware 143, application programming interface (API) 145, and/or application program (or "application") 147. At least a portion of the kernel 141, the middleware 143, and the API 145 may be referred to as an operating system (OS). The kernel 141 may control or manage, for example, system resources (e.g., the bus 110, the processor 120, or the memory 130) used for executing an operation or a function implemented in other programs (e.g., the middleware 143, the API 145, or the application program 147). Further, by accessing from the middleware 143, the API 145, and the application program 147 to an individual constituent element of the electronic device 101, the kernel 141 may provide an interface that can control or manage system resources.

The middleware 143 may perform, for example, an intermediary function of transmitting and receiving data by enabling the API 145 or the application program 147 to communicate with the kernel 141. Further, the middleware 143 may process at least one work request received from the application program 147 according to a priority. For example, the middleware 143 may give a priority for use of a system resource (e.g., the bus 110, the processor 120, or the memory 130) of the electronic device 101 to at least one of the application programs 147 and process the at least one work request. The API 145 is an interface that enables the application 147 to control a function that the kernel 141 or the middleware 143 provides and may include, for example, at least one interface or function (e.g., instruction) for a file control, window control, image processing, or text control. The input and output interface 150 may transfer, for example, a command or data input from a user or another external device to another component(s) of the electronic device 101 or may output a command or data received from another component(s) of the electronic device 101 to a user or another external device.

The display 160 may include, for example, a liquid crystal display (LCD), light emitting diode (LED) display, organic light emitting diode (OLED) display, micro electromechanical system (MEMS) display, or electronic paper (e-paper) display. The display 160 may display, for example, various contents (e.g., text, image, video, icon, and/or symbol) to a user. The display 160 may include a touch screen and may receive, for example, a touch, gesture, proximity, or hovering input using a portion of a user body or an electronic pen. The communication interface 170 may set, for example, communication between the electronic device 101 and an external device (e.g., a first external electronic device 102, second external electronic device 104, or server 106). For example, the communication interface 170 may be connected to a network 162 through wireless communication or wire communication to communicate with an external device (e.g., the second external electronic device 104 or the server 106).

Wireless communication may include cellular communication that uses at least one of, for example, long-term evolution (LTE), LTE advance (LTE-A), code division multiple access (CDMA), wideband CDMA (WCDMA), universal mobile telecommunications system (UMTS), wireless broadband (WiBro), and global system for mobile communications (GSM). According to an embodiment, wireless communication may include, for example, at least one of wireless fidelity (WiFi), Bluetooth, Bluetooth low energy (BLE), Zigbee, near field communication (NFC), magnetic secure transmission, radio frequency (RF), and body area network (BAN). According to an embodiment, wireless communication may include a global navigation satellite system (GNSS). The GNSS may be, for example, a global positioning system (GPS), global navigation satellite system (Glonass), Beidou navigation satellite system (hereinafter "Beidou") or Galileo, and European global satellite-based navigation system. Hereinafter, in this document, "GPS" may be interchangeably used with "GNSS". The wire communication may include at least one of, for example, a universal serial bus (USB), a high definition multimedia interface (HDMI), recommended standard 232 (RS-232), power line communication, and a Plain Old Telephone Service (POTS). The network 162 may include at least one of a telecommunication network, for example, a computer network (e.g., LAN or WAN), Internet, and a telephone network.

The first and second external electronic devices 102 and 104 each may be a device of the same kind as or a kind different from that of the electronic device 101. According to various embodiments, all or some of the operations executed in the electronic device 101 may be executed in another one electronic device or a plurality of electronic devices (e.g., the electronic devices 102 and 104 or the server 106). According to an embodiment, when the electronic device 101 should perform any function or service automatically or by a request, additionally or instead of executing a function or a service, the electronic device 101 may request at least a partial function related thereto to another device (e.g., the electronic devices 102 and 104 or the server 106). Another electronic device (e.g., the electronic devices 102 and 104 or the server 106) may execute a requested function or an additional function and transmit a result thereof to the electronic device 101. The electronic device 101 may provide a received result itself or a requested function or service by additional processing. For this purpose, for example, cloud computing, distributed computing, or client-server computing technology may be used.

Figure 2:
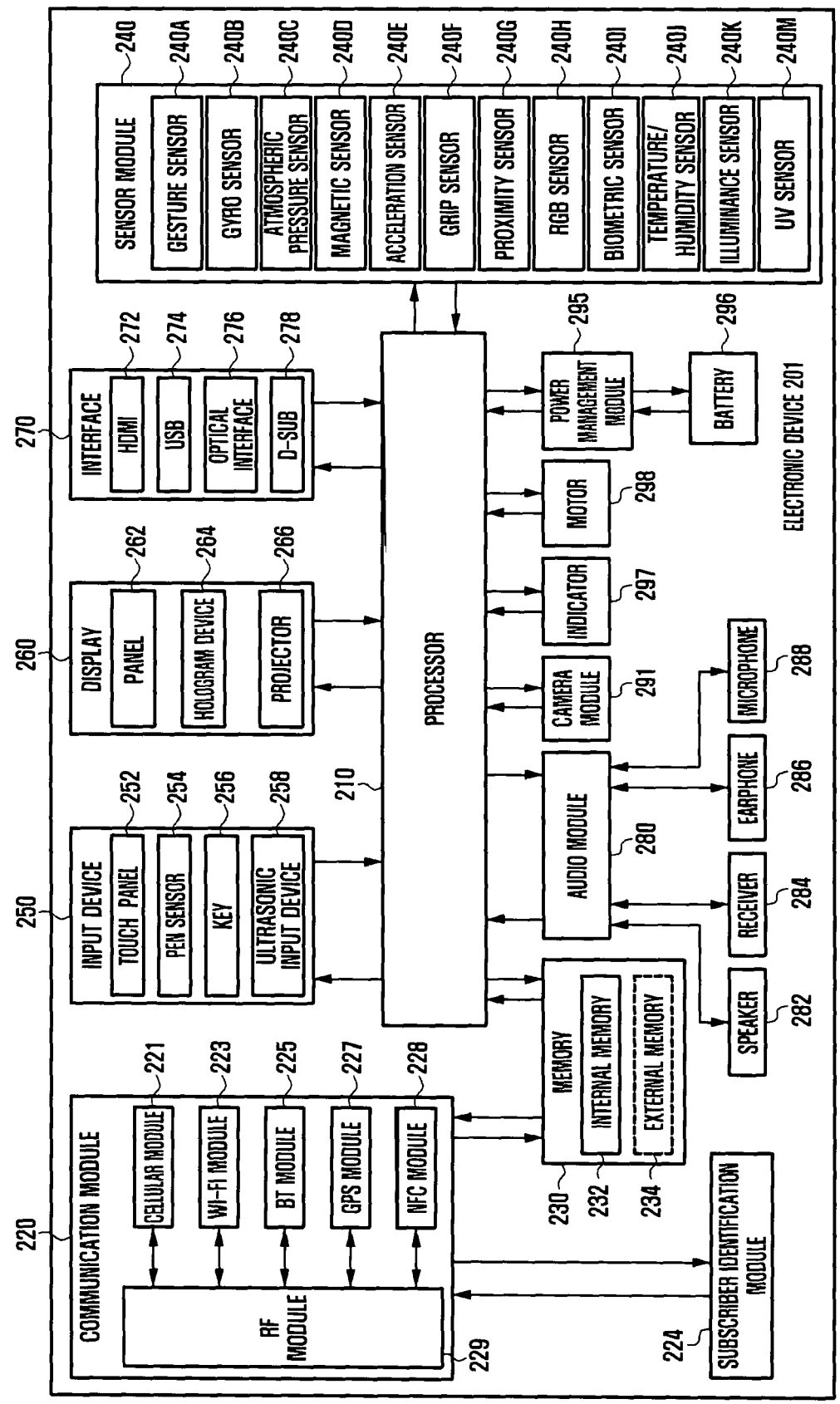
FIG. 2 is a block diagram illustrating a configuration of an electronic device according to various embodiments of the present invention.

FIG. 2 is a block diagram illustrating a configuration of an electronic device 201 according to various embodiments. The electronic device 201 may include, for example, all or some of the electronic device 101 of FIG. 1. The electronic device 201 may include at least one processor (e.g., AP) 210, communication module 220, (subscriber identity module 224), memory 230, sensor module 240, input device 250, display 260, interface 270, audio module 280, camera module 291, power management module 295, battery 296, indicator 297, and motor 298. By driving, for example, an operation system or an application program, the processor 210 may control a plurality of hardware or software components connected thereto and perform various data processing and calculation tasks. The processor 210 may be implemented into, for example, a system on chip (SoC). According to an embodiment, the processor 210 may further include a graphic processing unit (GPU) and/or an image signal processor. The processor 210 may include at least some (e.g., a cellular module 221) of constituent elements of FIG. 2. The processor 210 may load and process a command or data received from at least one of other constituent elements (e.g., a nonvolatile memory) at a volatile memory and store result data at the nonvolatile memory.

The communication module 220 may have the same configuration as or a configuration similar to that of, for example, the communication interface 170. The communication module 220 may include, for example, a cellular module 221, WiFi module 223, Bluetooth (BT) module 225, global positioning system (GPS) module 227, near field communication (NFC) module 228, and radio frequency (RF) module 229. The cellular module 221 may provide, for example, audio dedicated communication, audiovisual communication, a text service, or an Internet service through a communication network. According to an embodiment, the cellular module 221 may perform identification and authentication of the electronic device 201 within a communication network using the subscriber identity module (e.g., subscriber identification module (SIM) card) 224. According to an embodiment, the cellular module 221 may perform at least a partial function of functions that the processor 210 may provide. According to an embodiment, the cellular module 221 may include a communication processor (CP). According to an embodiment, at least some (e.g., two or more) of the cellular module 221, the WiFi module 223, the BT module 225, the GPS module 227, and the NFC module 228 may be included in one integrated chip (IC) or an IC package. The RF module 229 may transmit and receive, for example, a communication signal (e.g., an RF signal). The RF module 229 may include, for example, a transceiver, power amp module (PAM), frequency filter, low noise amplifier (LNA), or antenna. According to another embodiment, at least one of the cellular module 221, WiFi module 223, BT module 225, GPS module 227, and NFC module 228 may transmit and receive an RF signal through a separate RF module. The subscriber identity module 224 may include, for example, an embedded SIM or a card including a subscriber identity module, and it may include unique identification information (e.g., an integrated circuit card identifier (ICCID)) or subscriber information (e.g., international mobile subscriber identity (IMSI)).

The memory 230 (e.g., the memory 130) may include, for example, an internal memory 232 or an external memory 234. The internal memory 232 may include at least one of, for example, a volatile memory (e.g., dynamic read-only memory (DRAM), static read-only memory (SRAM), or synchronous dynamic read-only memory (SDRAM)), non-volatile memory (e.g., one time programmable ROM (OTPROM)), programmable read-only memory (PROM), erasable programmable read-only memory (EPROM), electrically erasable and programmable read-only memory (EEPROM), mask ROM, flash ROM, flash memory, hard drive, and solid state drive (SSD). The external memory 234 may include a flash drive, for example, compact flash (CF), secure digital (SD), micro-SD, mini-SD, extreme digital (xD), multi-media card (MMC), or memory stick. The external memory 234 may be functionally or physically connected to the electronic device 201 through various interfaces.

The sensor module 240 may measure, for example, a physical quantity or detect an operation state of the electronic device 201 and convert measured or detected information to an electric signal. The sensor module 240 may include at least one of, for example, a gesture sensor 240A, gyro sensor 240B, atmospheric pressure sensor 240C, magnetic sensor 240D, acceleration sensor 240E, grip sensor 240F, proximity sensor 240G, color sensor 240H, (e.g., red, green, and blue (RGB) sensor), biometric sensor 240I, temperature/humidity sensor 240J, illumination sensor 240K, and ultraviolet (UV) sensor 240M. Additionally or alternatively, the sensor module 240 may include, for example, an e-nose sensor, electromyograph (EMG) sensor, electroencephalogram (EEG) sensor, electrocardiogram (ECG) sensor, infrared (IR) sensor, iris sensor, and/or fingerprint sensor. The sensor module 240 may further include a control circuit for controlling at least one sensor that belongs therein. In an embodiment, the electronic device 201 further includes a processor configured to control the sensor module 240 as a portion of the processor 210 or separately from the processor 210; and, when the processor 210 is in a sleep state, the electronic device 201 may control the sensor module 240.

The input device 250 may include, for example, a touch panel 252, (digital) pen sensor 254, key 256, or ultrasonic input device 258. The touch panel 252 may use at least one method of, for example, capacitive, resistive, infrared ray, and ultrasonic wave methods. The touch panel 252 may further include a control circuit. The touch panel 252 may further include a tactile layer to provide a tactile response to a user. The (digital) pen sensor 254 may be, for example, a portion of a touch panel or may include a separate recognition sheet. The key 256 may include, for example, a physical button, optical key, or key pad. The ultrasonic input device 258 may detect ultrasonic waves generated in an input instrument through a microphone (e.g., a microphone 288) to determine data corresponding to the detected ultrasonic wave.

The display 260 (e.g., the display 160) may include a panel 262, hologram device 264, projector 266, and/or control circuit for controlling them. The panel 262 may be implemented with, for example, a flexible, transparent, or wearable method. The panel 262 and the touch panel 252 may be formed in at least one module. The hologram device 264 may show a stereoscopic image in the air using interference of light. The projector 266 may project light on a screen to display an image. The screen may be positioned, for example, at the inside or the outside of the electronic device 201. The interface 270 may include, for example, a high definition multimedia interface (HDMI) 272, universal serial bus (USB) 274, optical interface 276, or D-subminiature (D-sub) 278. The interface 270 may be included in, for example, the communication interface 170 of FIG. 1. Additionally or alternatively, the interface 270 may include, for example, a mobile high-definition link (MHL) interface, secure digital (SD) card/multi-media card (MMC) interface, or infrared data association (IrDA) specification interface.

The audio module 280 may bilaterally convert, for example, a sound and an electric signal. At least a partial constituent element of the audio module 280 may be included, for example, in the input and output interface 150 of FIG. 1. The audio module 280 may process sound information that is input or output through, for example, a speaker 282, receiver 284, earphone 286, or microphone 288. The camera module 291 may photograph, for example, a still picture and a moving picture and include at least one image sensor (e.g., a front surface lens or a rear surface lens), a lens, an image signal processor (ISP), or a flash (e.g., a light emitting diode (LED) or a xenon lamp) according to an embodiment. The power management module 295 may manage power of, for example, the electronic device 201. According to an embodiment, the power management module 295 may include a power management integrated circuit (PMIC), charge integrated circuit (IC), battery, or fuel gauge. The PMIC may have a wired and/or wireless charge method. The wireless charge method may include, for example, a magnetic resonance method, magnetic induction method, or electromagnetic wave method and may further include an additional circuit, for example, a coil loop, resonant circuit, and rectifier for wireless charge. The battery gauge may measure, for example, a residual quantity of the battery 296, a voltage, a current, or a temperature while charging. The battery 296 may include, for example, a rechargeable battery and/or a solar battery.

The indicator 297 may display a specific state, for example, a booting state, a message state, or a charge state of the electronic device 201 or some component (e.g., the processor 210) thereof. The motor 298 may convert an electric signal to a mechanical vibration and generate a vibration or a haptic effect. The electronic device 201 may include, for example, a mobile TV support device (e.g., GPU) that can process media data according to a specification such as digital multimedia broadcasting (DMB), digital video broadcasting (DVB), or mediaFlo™. The elements each described in this document may be configured with at least one component, and a name of a corresponding element may be changed according to a kind of the electronic device. In various embodiments, some constituent elements of the electronic device (e.g., the electronic device 201) may be omitted, the electronic device may further include an additional constituent element, or some constituent elements may be coupled to configure one entity, thereby performing a function of corresponding constituent elements before coupling.

Figure 3:
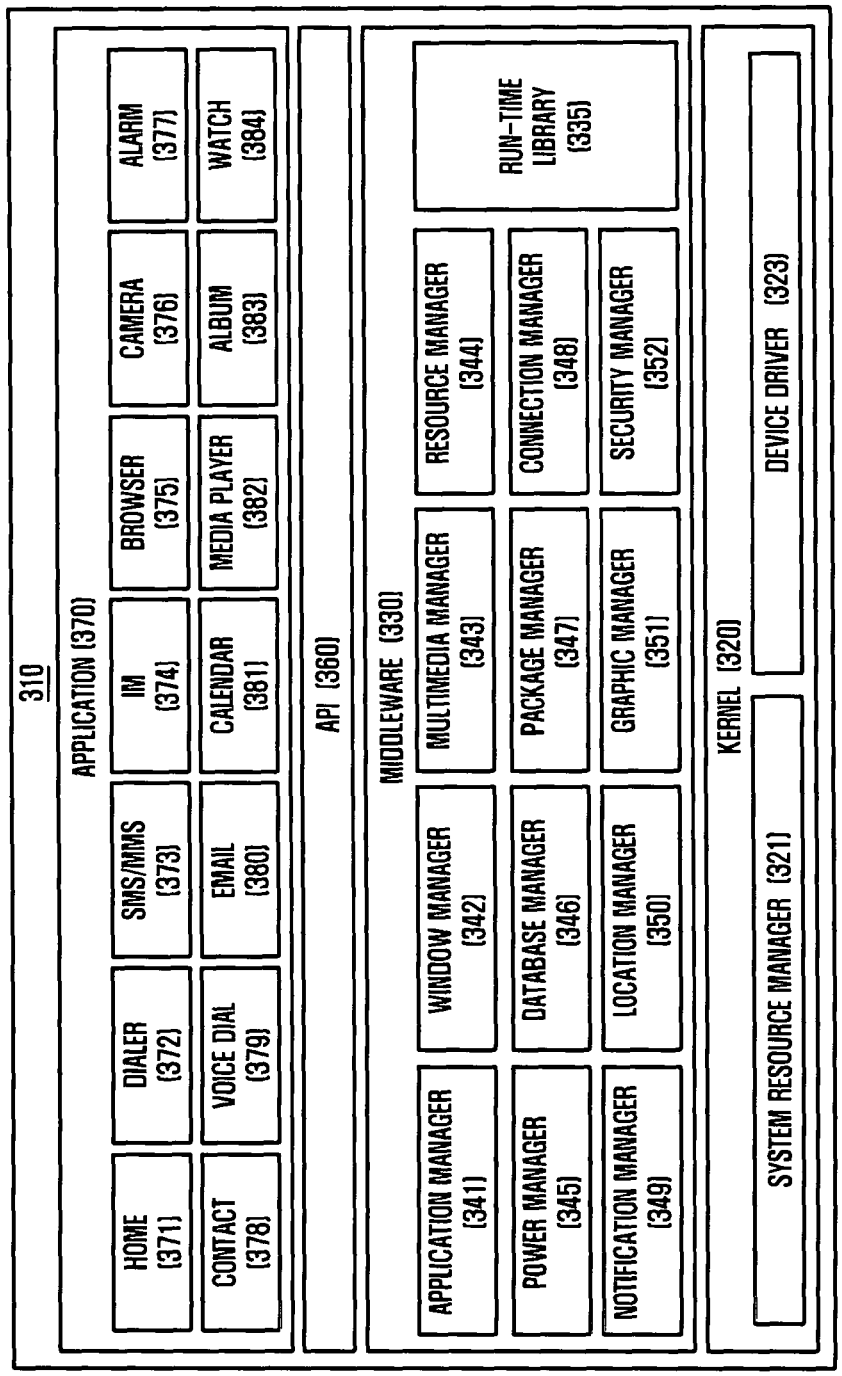
FIG. 3 is a block diagram illustrating a configuration of a program module according to various embodiments of the present invention.

FIG. 3 is a block diagram illustrating a configuration of a program module according to various embodiments of the present invention. According to an embodiment, a program module 310 (e.g., the program 140) may include an operating system for controlling resources related to an electronic device (e.g., the electronic device 101) and/or various applications (e.g., the application program 147) driven on the operating system. The operating system may include, for example, Android™, iOS™, Windows™, Symbian™, Tizen™, or Bada™ With reference to FIG. 3, the program module 310 may include a kernel 320 (e.g., the kernel 141), middleware 330 (e.g., the middleware 143), API 360 (e.g., the API 145), and/or application 370 (e.g., the application program 147). At least some of the program module 310 may be pre-loaded on the electronic device or may be downloaded from an external electronic device (e.g., the electronic devices 102 and 104 and the server 106)

The kernel 320 may include, for example, a system resource manager 321 and/or a device driver 323. The system resource manager 321 may control, allocate, or recover a system resource. According to an embodiment, the system resource manager 321 may include a process management unit, a memory management unit, or a file system management unit. The device driver 323 may include, for example, a display driver, camera driver, Bluetooth driver, sharing memory driver, universal serial bus (USB) driver, keypad driver, WiFi driver, audio driver, or inter-process communication (IPC) driver. The middleware 330 may provide, for example, a function in which the application 370 commonly requires or may provide various functions to the application 370 through the API 360 so that the application 370 uses a limited system resource within the electronic device. According to an embodiment, the middleware 330 may include at least one of a run-time library 335, application manager 341, window manager 342, multimedia manager 343, resource manager 344, power manager 345, database manager 346, package manager 347, connectivity manager 348, notification manager 349, location manager 350, graphic manager 351, and security manager 352.

In order to add a new function through a programming language, for example, while the application 370 is being executed, the run-time library 335 may include a library module that a compiler uses. The run-time library 335 may perform input and output management, memory management, or arithmetic function processing. The application manager 341 may manage, for example, a life cycle of the application 370. The window manager 342 may manage GUI resources used in a screen. The multimedia manager 343 may determine a format required for reproduction of media files and perform encoding or decoding of media files using a codec corresponding to the format. The resource manager 344 may manage a source code of the application 370 or a space of the memory. The power manager 345 may manage, for example, a capacity or power of the battery and provide power information necessary for an operation of the electronic device. According to an embodiment, the power manager 345 may be interworked with a basic input/output system (BIOS). The database manager 346 may generate, retrieve, or change, for example, a database to be used in the application 370. The package manager 347 may manage installation or update of an application distributed in a format of a package file.

The connectivity manager 348 may manage, for example, a wireless connection. The notification manager 349 may provide, for example, an event such as an arrival message, appointment, and proximity notification to a user. The location manager 350 may manage, for example, location information of the electronic device. The graphic manager 351 may manage, for example, a graphic effect to be provided to a user or a user interface related thereto. The security manager 352 may provide, for example, system security or user authentication. According to an embodiment, the middleware 330 may include a middleware module that can form a combination of functions of the above-described components or a telephony manager for managing an audio dedicated call or audiovisual call function of the electronic device. According to an embodiment, the middleware 330 may provide a module specified for each kind of an operating system. Further, the middleware 330 may dynamically delete some of existing constituent elements or add new constituent elements. The API 360 may be provided with another configuration according to an operation system with, for example, a set of API programming functions. For example, in Android or iOS, a single API set may be provided for each platform, and in Tizen, at least two API sets may be provided for each platform.

The application 370 may include, for example, a home 371, dialer 372, short message service (SMS)/multimedia messaging service (MMS) 373, instant message (IM) 374, browser 375, camera 376, alarm 377, contact 378, voice dial 379, email 380, calendar 381, media player 382, album 383, watch 384, health care (e.g., measurement of an exercise amount or blood sugar), or environmental information (atmosphere, humidity, or temperature information) providing application. According to an embodiment, the application 370 may include an information exchange application that can support information exchange between the electronic device and the external electronic device. The information exchange application may include, for example, a notification relay application for transmitting specific information to an external electronic device or a device management application for managing an external electronic device. For example, the notification transfer application may transfer notification information generated in other applications of the electronic device to an external electronic device or may receive notification information from the external electronic device to provide the notification information to the user. For example, the device management application may install, remove, or update functions (e.g., turn on/turn off of the external electronic device itself (or some components) or control brightness (or resolution) of the display) of the external electronic device communicating with the electronic device or an application operating in the external electronic device. According to an embodiment, the application 370 may include a designated application (e.g., a healthcare application of a mobile medical device) according to a property of the external electronic device. According to an embodiment, the application 370 may include an application received from the external electronic device. At least some of the program module 310 may be implemented (e.g., executed) into software, firmware, hardware (e.g., the processor 210), or a combination of at least two thereof and include a module, program, routine, instruction set, or process for performing at least one function.

Figure 4A:
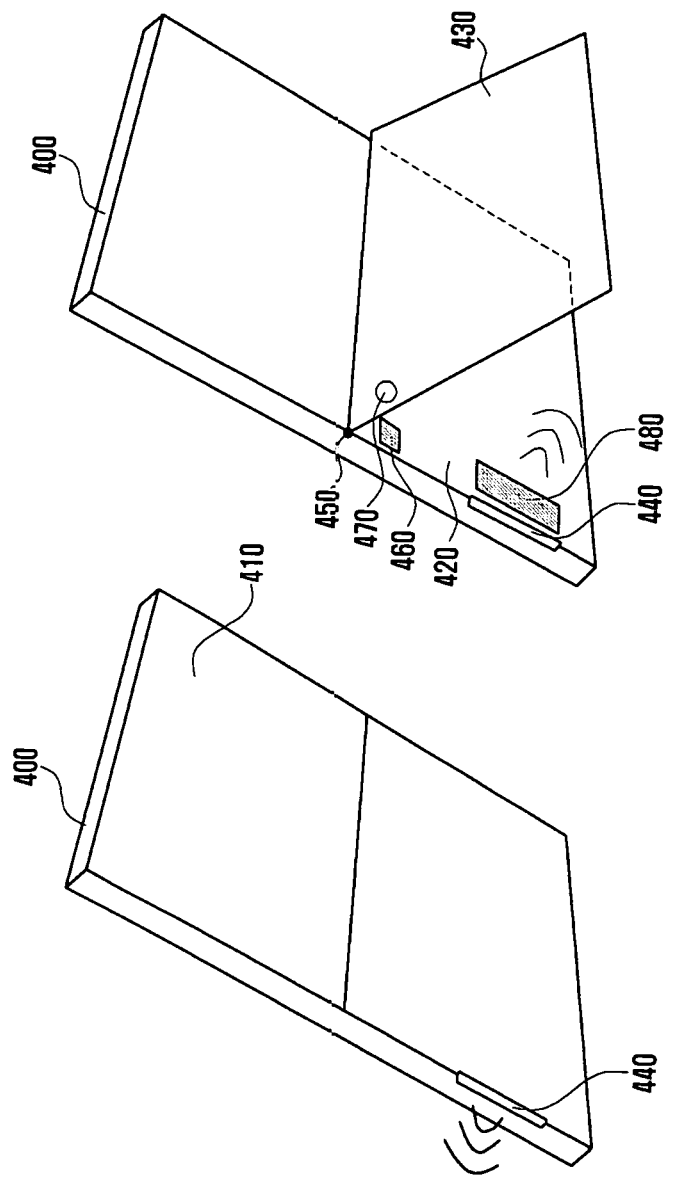
FIG. 4A is a perspective view illustrating an electronic device according to various embodiments of the present invention.
Figure 4B:
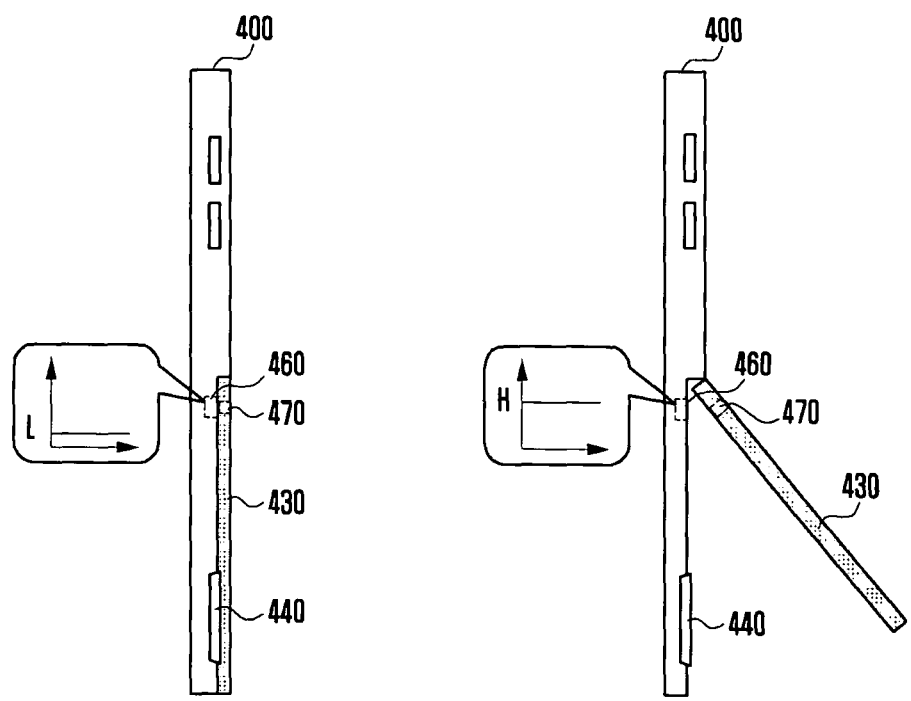
FIG. 4B is a side view illustrating an electronic device according to various embodiments of the present invention.

FIG. 4A is a perspective view illustrating an electronic device according to various embodiments of the present invention, and FIG. 4B is a side view illustrating an electronic device according to various embodiments of the present invention.

According to an embodiment, a rear surface of an electronic device 400 may include a first area 410 and a second area 420. According to an embodiment, the electronic device 400 may include a support structure 430 (e.g., kickstand) having one end connected to a boundary of the first area 410 and the second area 420 of the rear surface and that can rotate in one direction. According to an embodiment, the support structure 430 may rotate in one direction based on a hinge 450 disposed at the first area 410 and the second area 420 of the rear surface of the electronic device 400 to be opened or closed. According to an embodiment, the second area 420 of the rear surface of the electronic device 400 may be exposed to the outside or may be hidden by the support structure 430 according to opening and closing of the support structure 430. For example, when the support structure 430 is closed, the support structure 430 may cover the second area 420 of the rear surface of the electronic device 400. For example, when the support structure 430 is closed, the support structure 430 may configure a partial area of the rear surface of the electronic device 400. For example, when the support structure 430 is closed, the first area 410 of the rear surface of the electronic device 400 and an outer surface of the support structure 430 may form a single plane. According to various embodiments, the support structure 430 may have a size corresponding to all or some of the second area 420 of the rear surface of the electronic device 400.

For example, when the support structure 430 is open, the support structure 430 may support the electronic device 400. For example, when the electronic device 400 is in a predetermined posture (e.g., when the electronic device 400 has a predetermined slope to a reference surface), the electronic device 400 may be supported in a fixed posture by the support structure 430.

According to an embodiment, the second area 420 of the rear surface of the electronic device 400 may include a rear sensor 460 that detects whether the support structure 430 is open or closed. For example, the rear sensor 460 may include a Hall sensor. For example, the rear sensor 460 may include a well-known sensor that detects a magnetic force.

The support structure 430 may include a magnetic material 470 at a position corresponding to that of the rear sensor 460 of the electronic device 400. According to an embodiment, by sensing a magnetic force emitted from the magnetic material 470 of the support structure 430, the rear sensor 460 may detect whether the support structure 430 is open or closed. For example, the rear sensor 460 may generate a signal of different values according to a distance to the magnetic material 470 included in the support structure 430. For example, when the support structure 430 is closed, the rear sensor 460 may output a low signal, and when the support structure 430 is open, the rear sensor 460 may output a high signal. According to an embodiment, the rear sensor 460 may transfer a changed signal to the processor of the electronic device 400 according to opening and closing of the support structure 430. The processor may determine whether the support structure 430 is open or closed based on at least some of signals received from the rear sensor 460.

According to various embodiments, the second area 420 of the rear surface may include at least one of a speaker 480, woofer, vent hole, microphone, and light source. For example, the electronic device 400 may detect when the second area 420 of the rear surface is exposed by opening of the support structure 430 to operate at least one element provided in the second area 420 of the rear surface. For example, the electronic device 400 may determine a size of a space formed between the second area 420 of the rear surface and the support structure 430 and control an operation of at least one element provided in the second area 420 of the rear surface according to the size of the formed space.

According to an embodiment, the electronic device 400 may have a groove 440 at one side surface corresponding to the second area 420 of the rear surface. For example, the groove 440 provided at one side surface of the electronic device 400 may be used when the user opens the support structure 430 in order to rotate the support structure 430. For example, the side groove 440 of the electronic device 400 may be a path for emitting a sound or a heat output from the electronic device 400. According to an embodiment, the second area 420 of the rear surface or an inner surface of the support structure 430 may include an emission path for emitting a sound, heat, or light output from the second area 420 of the rear surface of the electronic device 400 to the outside of the electronic device 400. For example, the emission path may have an engraving structure from a periphery of a position of a light source, a speaker, or a vent hole included in the second area 420 of the rear surface of the electronic device 400 to the outside of the electronic device 400. For example, the emission path may have an engraving structure from a periphery of a position of a light source, a speaker, or a vent hole included in the second area 420 of the rear surface of the electronic device 400 to the groove 440. For example, in a state in which the support structure 430 of the electronic device 400 is closed, when light, a sound, or heat is output from a light source, a speaker, or a vent hole included in the second area 420 of the rear surface of the electronic device 400, the light, sound, or heat may be easily emitted to the outside of the electronic device 400 through the groove 440 along the emission path (e.g., the engraving structure).

Figure 5:
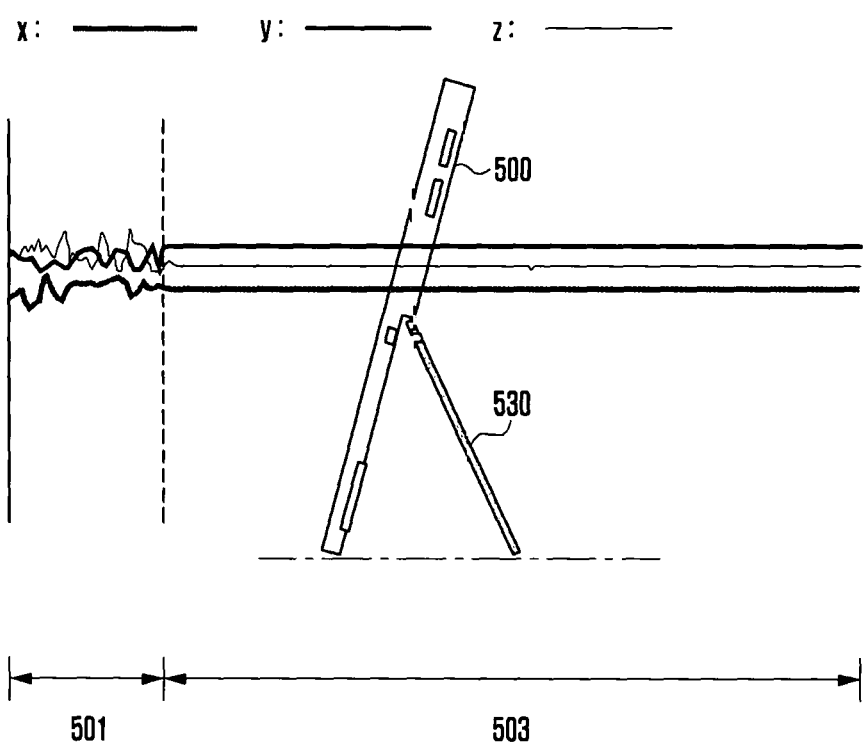
FIG. 5 is a diagram illustrating an operation of an electronic device according to various embodiments of the present invention.

FIG. 5 is a diagram illustrating an operation of an electronic device according to various embodiments of the present invention.

According to an embodiment, an electronic device 500 may determine whether the electronic device 500 is supported using at least one sensor. For example, the electronic device 500 may determine whether the electronic device 500 is supported by using a gyro sensor or an acceleration sensor. For example, the electronic device 500 may detect a state change value of the electronic device 500 to three shafts using the sensor to determine a movement of the electronic device 500. According to an embodiment, when the electronic device 500 detects that a support structure 530 is open, the electronic device 500 may detect a movement (e.g., a level of a direction and a movement of the electronic device 500) thereof using the sensor. For example, when a change width of a sensing value through the sensor is less than a predetermined threshold value for a predetermined time, the electronic device 500 may determine that the electronic device 500 is supported.

For example, a segment 501 represents a state before the electronic device 500 is supported. For example, when a user wants to support the electronic device 500, the user may open the support structure 530 of the electronic device 500 and move the electronic device 500 in order to support the electronic device 500 in a predetermined angle on a reference plane. In this case, a sensing value measured by the electronic device 500 may have a shaking value instead of a fixing value or may be relatively greatly fluctuated. For example, a segment 503 represents a state in which the support of the electronic device 500 is complete. When the support of the electronic device 500 is complete, the electronic device 500 may maintain a predetermined posture without a large movement. In this case, a sensing value measured by the electronic device 500 may be maintained without a large change for a predetermined time or more. According to various embodiments, the electronic device 500 may determine that the electronic device is supported based on the sensing value of a movement of the electronic device 500 and perform a specific function. For example, when the electronic device is supported, the electronic device 500 may operate a speaker or a woofer included in a second area of a rear surface, emit light by operating a light source included in a second area of a rear surface, receive a sound through a microphone included in a second area of a rear surface, or emit heat through a vent hole included in a second area of a rear surface by operating a fan.

According to an embodiment, the electronic device 500 may detect that an external electronic device 500 is connected. The electronic device 500 may determine a type of the connected external electronic device 500. According to an embodiment, the electronic device 500 may additionally detect whether the external device is connected to determine whether the electronic device 500 is supported. For example, when a peripheral device (e.g., an accessory device such as a keyboard, mouse, or stand cover) is connected, the electronic device 500 may determine that the electronic device 500 is supported.

Figure 6:
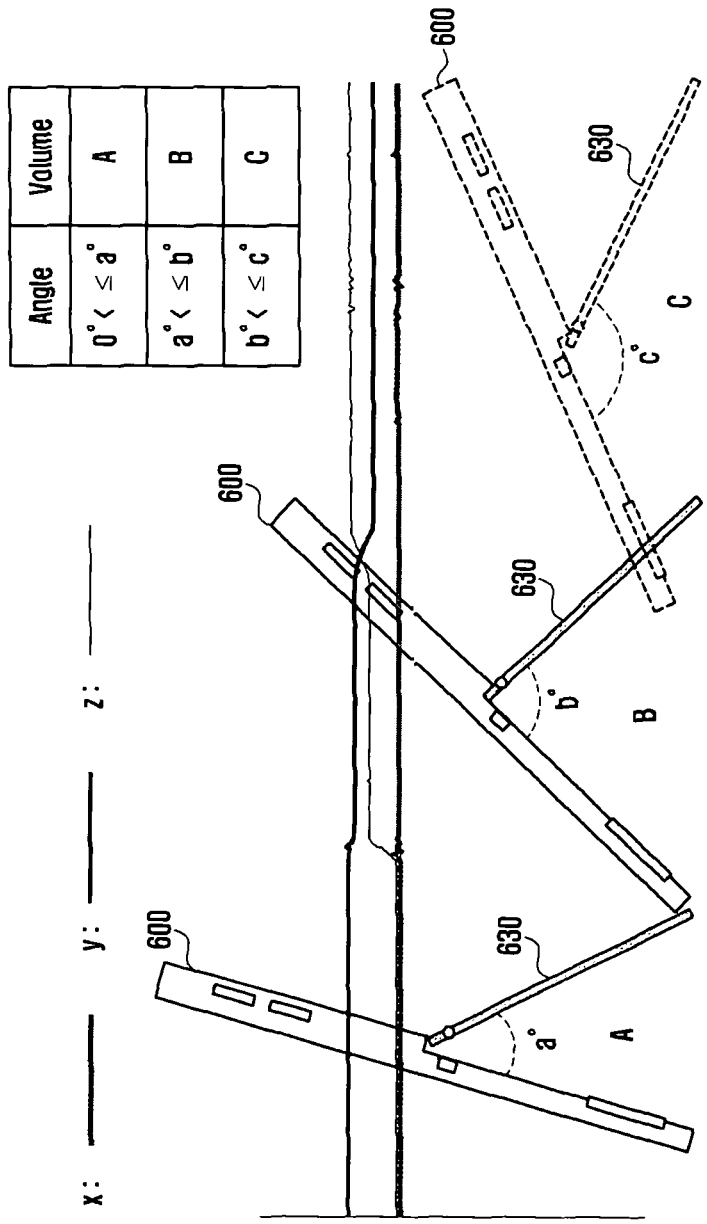
FIG. 6 is a diagram illustrating an operation of an electronic device according to various embodiments of the present invention.

FIG. 6 is a diagram illustrating an operation of an electronic device according to various embodiments of the present invention.

According to an embodiment, an electronic device 600 may be supported in various slopes according to a rotation angle of a support structure 630. According to an embodiment, the electronic device 600 may control a state or an operation thereof according to a support angle. The electronic device 600 may control a state or an operation thereof according to a size of a space formed between a second area of a rear surface of the electronic device 600 and the support structure 630 upon the support structure 630 supporting the electronic device 600.

According to an embodiment, the electronic device 600 may detect a change of a support angle thereof. For example, when the support structure 630 is opened, the electronic device 600 may detect a movement thereof using at least one sensor. For example, the electronic device 600 may detect a state change thereof to three shafts using a gyro sensor or an acceleration sensor. When a change width of the sensing values is maintained to less than a predetermined threshold value for a predetermined time or more, the electronic device 600 may determine that the electronic device 600 is supported. When the sensing values are changed to a predetermined threshold value or more, the electronic device 600 may determine that a support angle of the electronic device 600 is changed. For example, when a support angle of the electronic device 600 is changed, a direction of the electronic device 600 may be changed or a level of a movement of the electronic device 600 may increase. In this case, by detecting a change of the sensing values, the electronic device 600 may detect that a support angle of the electronic device 600 is changed. After the sensing values are changed, when a change width of the sensing values is again maintained to less than a threshold value for a predetermined time or more, the electronic device 600 may determine that the electronic device 600 is again supported in a changed slope.

According to an embodiment, when the electronic device 600 is supported, the electronic device 600 may detect a slope to a reference surface thereof using the sensor. For example, the electronic device 600 may determine a size of a space formed by the second area of the rear surface, the support structure 630, and the reference surface of the electronic device 600 based on the slope to a reference surface thereof. For example, the electronic device 600 may already store information about a length of a width thereof and a length of the support structure 630. The electronic device 600 may determine a size of a space formed by the second area of the rear surface, the support structure 630, and the reference surface thereof based on the stored information and the detected slope. For example, when the electronic device 600 is supported on the reference surface, a side surface of the second area of the rear surface of the electronic device 600 and the reference surface and a side surface of the support structure 630 may have a form of an isosceles triangle. Accordingly, when the electronic device 600 detects a slope to the reference surface thereof, the electronic device 600 may calculate a rotation angle of the support structure 630 and a size of a space formed by the second area of the rear surface, the support structure 630, and the reference surface thereof. For example, when an open angle of the support structure 630 of the electronic device 600 gradually increases, a size of a space formed by the second area of the rear surface, the support structure 630, and the reference surface of the electronic device 600 may gradually increase.

According to various embodiments, while performing a specific function (e.g., sound output, light output, or fan operation), the electronic device 600 may control a performing operation according to a size of a space formed at the rear surface thereof. According to an embodiment, the electronic device 600 may include a speaker in the second area of the rear surface. For example, the electronic device 600 may control an output of the speaker according to a size of a space formed at the rear surface thereof. For example, the electronic device 600 may change an output setting value of the speaker disposed in the second area of the rear surface based on at least a portion of the size of the space formed at the rear surface. According to an embodiment, the electronic device 600 may include at least one light source in the second area of the rear surface thereof. For example, the electronic device 600 may output light related to contents displayed on a front display of the electronic device 600 or a current state of the electronic device 600 using a light source. According to an embodiment, the electronic device 600 may include a vent hole in a second area of the rear surface. The electronic device 600 may operate a fan included therein to emit heat through the vent hole of the second area of the rear surface. The electronic device 600 may control an operation (e.g., operation speed or intensity of the fan) of the fan according to a size of a space formed at the rear surface.

Figure 7:
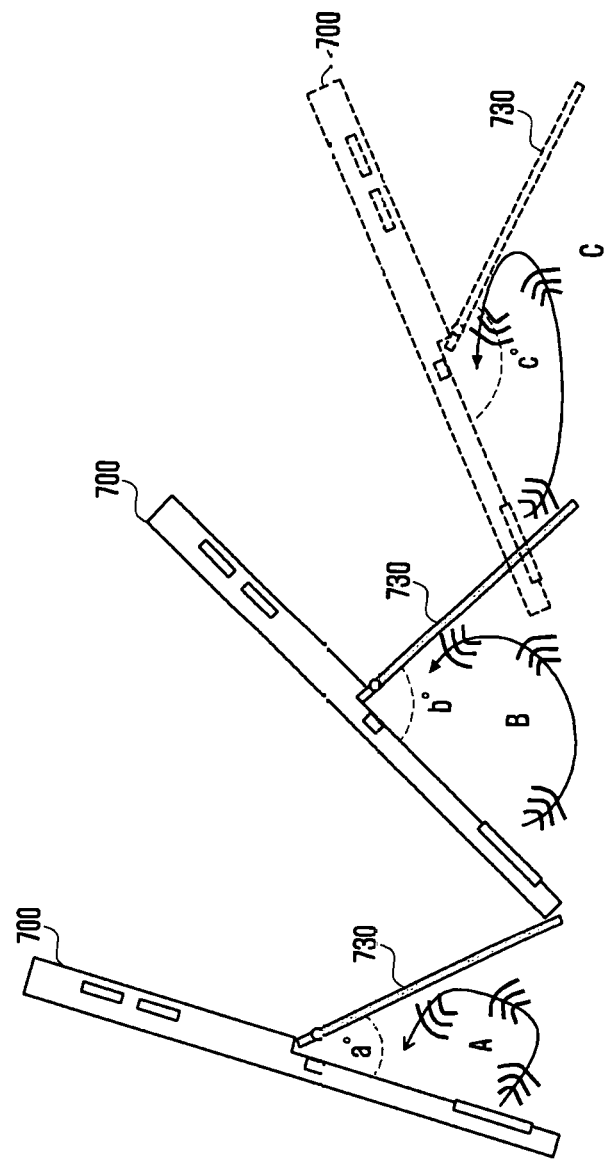
FIG. 7 is a diagram illustrating an operation of an electronic device according to various embodiments of the present invention.

FIG. 7 is a diagram illustrating an operation of an electronic device according to various embodiments of the present invention.

According to an embodiment, a rear surface of an electronic device 700 may include a first area and a second area. The electronic device 700 may include a support structure 730 that can rotate in one direction based on a hinge provided at a boundary of the first area and the second area. The second area of the rear surface of the electronic device 700 may be exposed to the outside by a rotation of the support structure 730. According to an embodiment, the second area of the rear surface of the electronic device 700 may include a speaker or a woofer. For example, the support structure 730 of the electronic device 700 may support the electronic device 700 at a predetermined posture while exposing the speaker of the rear surface of the electronic device 700 by rotating in one direction.

According to an embodiment, when the electronic device 700 is supported by the support structure 730, a specific space may be formed at the rear surface of the electronic device 700 by the second area of the rear surface of the electronic device 700, the support structure 730, and the reference surface (e.g., the bottom). According to an embodiment, the electronic device 700 may control an output of a speaker or a woofer according to a size of a space formed at the rear surface. For example, when the electronic device 700 outputs a sound through the speaker of the second area of the rear surface, a space formed at the rear surface of the electronic device 700 may be used as a resonance space of the sound. For example, a sound output to the rear surface of the electronic device 700 may be reflected and overlapped from the second area of the rear surface of the electronic device 700, an inner surface of the support structure 730, and the reference surface to be amplified. A boosting level of a sound output from the electronic device 700 may be different according to a size of a space formed at the rear surface of the electronic device 700. According to an embodiment, by changing an output of the speaker according to the size of the space formed at the rear surface, the electronic device 700 may maximize a resonance effect of the sound. For example, the electronic device 700 may change a gain value, an equalizer value, and a filter value of a sound according to the size of the space formed at the rear surface. According to various embodiments, output setting values of a sound according to a space formed at the rear surface have been already set or may be set or changed according to a user input.

According to an embodiment, the electronic device 700 may include a microphone (not shown) at the second space of the rear surface. The electronic device 700 may receive a sound output through the speaker through the microphone. The electronic device 700 may analyze a sound received through the microphone to determine whether noise, such as howling or buzzing, has occurred in the output sound. When noise has occurred in the output sound, the electronic device 700 may change a setting value of the output sound in order to remove the noise.

According to an embodiment, the electronic device 700 may include a noise removal module (e.g., an active noise cancellation (ANC) processor) therein. According to an embodiment, a microphone included in a second space of the rear surface of the electronic device 700 may be electrically connected to the noise removal module (e.g., an ANC processor). For example, the electronic device 700 may process a signal of a sound received through the microphone of the second space of the rear surface in the ANC processor. The ANC processor may process a signal of a sound to generate a noise removal signal (e.g., an anti-noise signal). A noise removal signal generated by the ANC processor may be transmitted to at least one output device (e.g., audio device) included in the electronic device 700 to reduce noise of a signal output by the electronic device 700.

In the electronic device 700 according to various embodiments of the present invention, by changing an output setting of a sound according to a size of a space formed by the rear surface and the support structure 730 of the electronic device 700 upon supporting the electronic device, a more excellent sound effect can be provided to the user.

Figure 8:
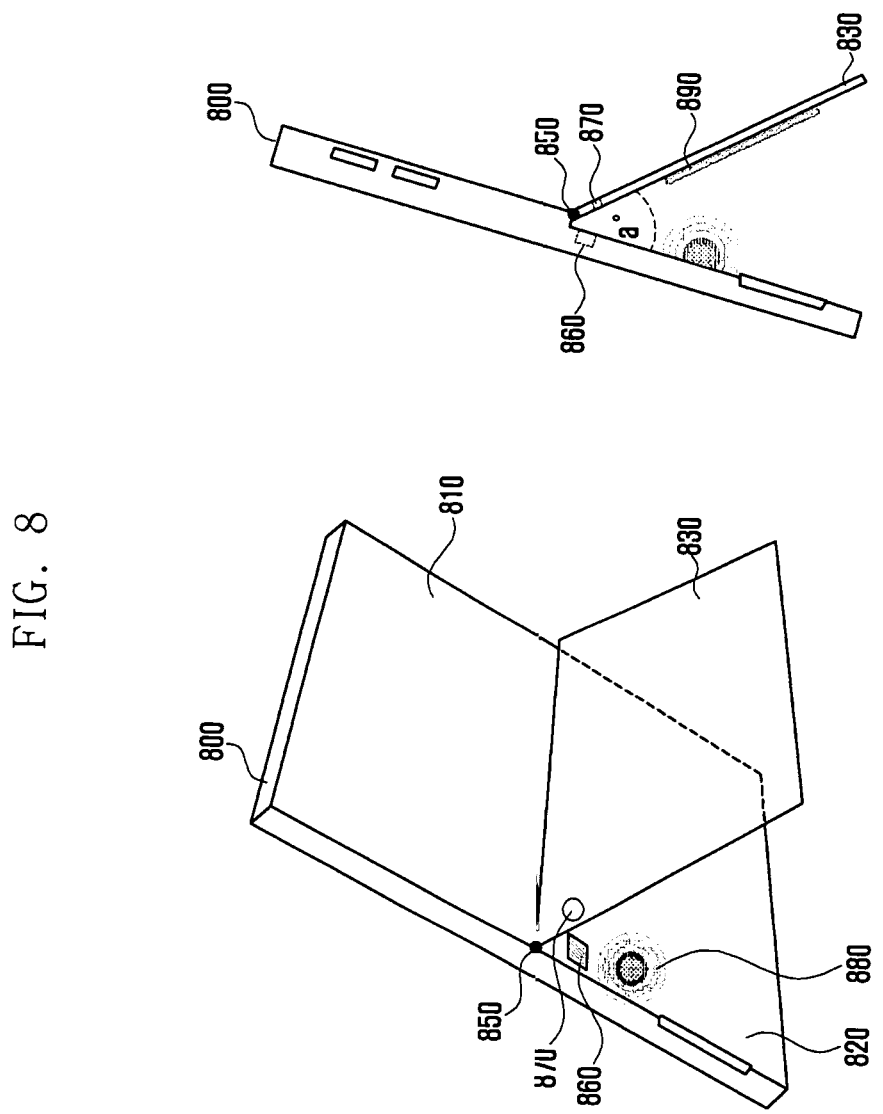
FIG. 8 is a diagram illustrating an operation of an electronic device according to various embodiments of the present invention.

FIG. 8 is a diagram illustrating an operation of an electronic device according to various embodiments of the present invention.

According to an embodiment, a rear surface of an electronic device 800 may include a first area 810 and a second area 820 exposed according to a rotation of a support structure 830. The support structure 830 may rotate in one direction based on a hinge 850. According to an embodiment, the second area 820 of the rear surface of the electronic device 800 may include a rear sensor 860. The support structure 830 may include a magnetic material 870 at a position corresponding to the rear sensor 860. The electronic device 800 may detect a magnetic force emitted from the magnetic material 870 using the rear sensor 860 to determine whether the support structure 830 is open or closed.

According to an embodiment, the second area 820 of the rear surface of the electronic device 800 may include at least one light source 880. For example, the electronic device 800 may include at least one light emitting diode (LED) in the second area 820 of the rear surface. According to an embodiment, the inner surface of the support structure 830 may include a reflector 890 that reflects light emitted by the light source 880 of the second area 820 of the rear surface. For example, when the electronic device 800 emits light from the light source 880 of the second area 820 of the rear surface, the emitted light may be reflected by the reflector 890 of the support structure 830 to be diffused to a side surface of the electronic device 800.

According to an embodiment, when the electronic device 800 detects that the support structure 830 is open, the electronic device 800 may operate the light source 880 included in the second area 820 of the rear surface. When the second area 820 of the rear surface is exposed by opening of the support structure 830, the electronic device 800 may emit light from the light source 880.

According to various embodiments, the electronic device 800 may change a color or an emission form of light emitted from the light source 880 based on a support state, an operating state, or a performing operation thereof. For example, the electronic device 800 may emit light in various patterns according to a performing function. For example, when the electronic device 800 charges the battery, the electronic device 800 may continuously output light, and when a residual quantity of the battery is low (low battery state), the electronic device 800 may flicker light. For example, the electronic device 800 may output light in various patterns according to a function that the electronic device 800 currently provides, such as audio recording and notification (message) reception.

Figure 9:
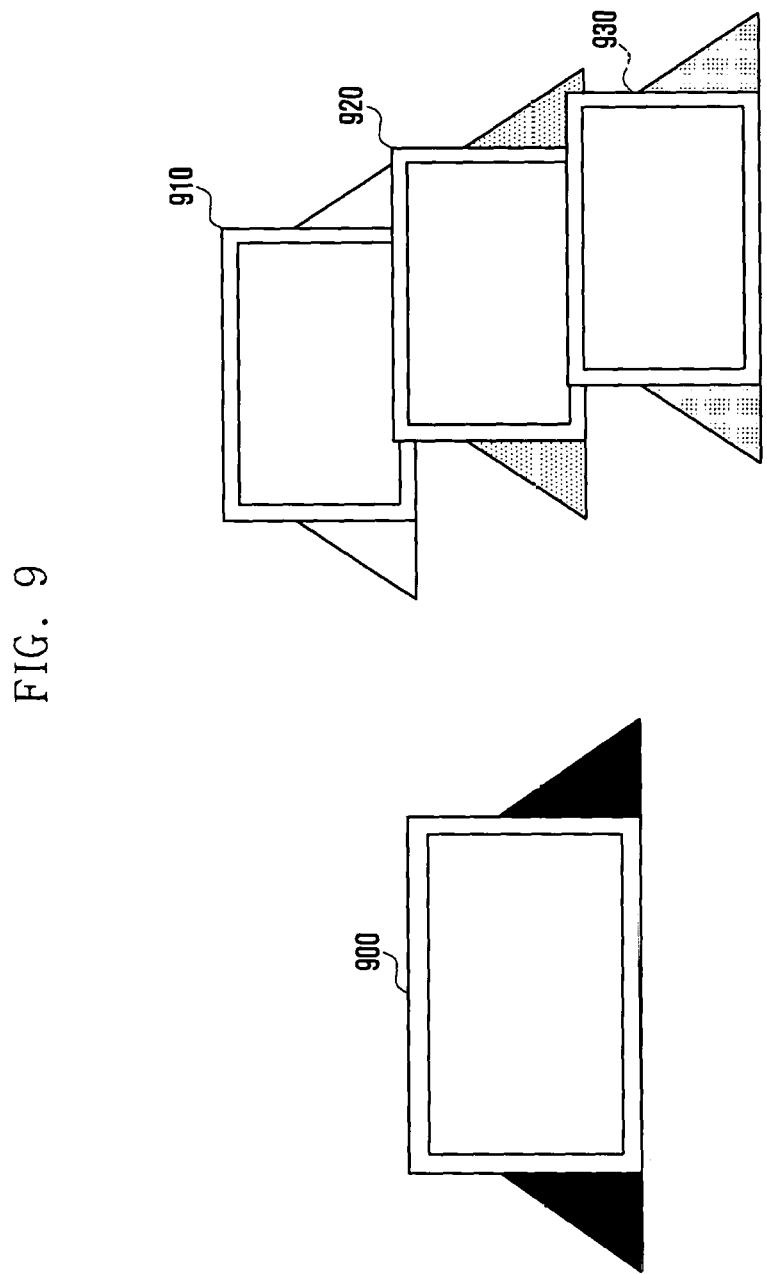
FIG. 9 is a diagram illustrating an operation of an electronic device according to various embodiments of the present invention.

FIG. 9 is a diagram illustrating an operation of an electronic device according to various embodiments of the present invention. FIG. 9 is a diagram illustrating a shape of a front surface of electronic devices 900, 910, 920, and 930 when the electronic devices 900, 910, 920, and 930 emit light from a light source disposed at the rear surface thereof. For example, when the electronic devices 900, 910, 920, and 930 are supported, light reflected from a space formed by the rear surface of the electronic devices 900, 910, 920, and 930, a support structure, and a reference surface in which the electronic devices 900, 910, 920, and 930 are supported may be emitted to a side surface of the electronic devices 900, 910, 920, and 930.

According to an embodiment, the electronic devices 900, 910, 920, and 930 may emit light of different colors according to a state or a performing operation thereof and output light of a color related to contents displaying in a front display thereof. For example, the electronic devices 900, 910, 920, and 930 may output red light while charging the battery, output green light when charging of the battery is complete, output blue light when receiving a notification, and output yellow light while recording a sound. In another embodiment, the electronic devices 900, 910, 920, and 930 may output light of a color synchronized with an image displaying in the display. According to an embodiment, the electronic devices 900, 910, 920, and 930 determine a size of a space formed at the rear surface thereof and emit various colors of light according to the size of the space formed at the rear surface. According to various embodiments, a color and a pattern of light that the electronic devices 900, 910, 920, and 930 output according to a current state or function are not limited to the example described above and may be variously set or changed according to a user input.

According to various embodiments of the present invention, by diffusing light to a periphery of the electronic devices 900, 910, 920, and 930 through a space formed at the rear surface, when the user uses the electronic devices 900, 910, 920, and 930, a sense of immersion increases and the user can more easily recognize a current state of the electronic devices 900, 910, 920, and 930 using light.

Figure 10:
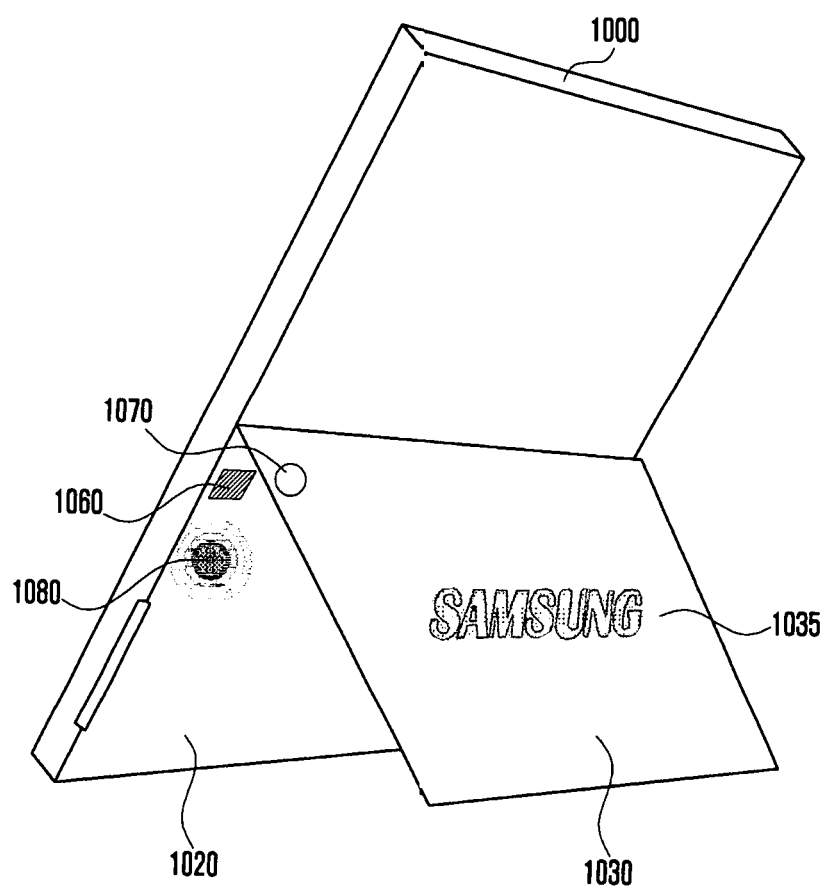
FIG. 10 is a diagram illustrating an operation of an electronic device according to various embodiments of the present invention.

FIG. 10 is a diagram illustrating an operation of an electronic device according to various embodiments of the present invention.

According to an embodiment, an electronic device 1000 may include a support structure 1030 having one end connected at a rear surface thereof and that can rotate in one direction based on the connected one end. The electronic device 1000 may expose an inner surface 1020 according to a rotation of the support structure 1030. According to an embodiment, the inner surface 1020 of the electronic device 1000 may include a rear sensor 1060. The support structure 1030 may include a magnetic material 1070 at a position corresponding to the rear sensor 1060. The electronic device 1000 may detect intensity of a magnetic force emitted from the magnetic material 1070 using the rear sensor 1060 to determine whether the support structure 1030 is open or closed. According to an embodiment, the inner surface 1020 of the electronic device 1000 may include a light source 1080. When the electronic device 1000 is supported by the support structure 1030 by a rotation of the support structure 1030, the electronic device 1000 may output light from the light source 1080 of the inner surface. According to an embodiment, the support structure 1030 may include a groove or a transparent (or translucent) portion 1035 of a specific form. For example, the support structure 1030 of the electronic device 1000 may include a portion 1035 of a transparent material or a groove related to a brand name or a trade name of a product. For example, when the electronic device 1000 is supported, light emitted from the light source 1080 of the inner surface of the electronic device 1000 may be projected to the outside through a groove or the transparent portion 1035 of the support structure 1030.

Figure 11:
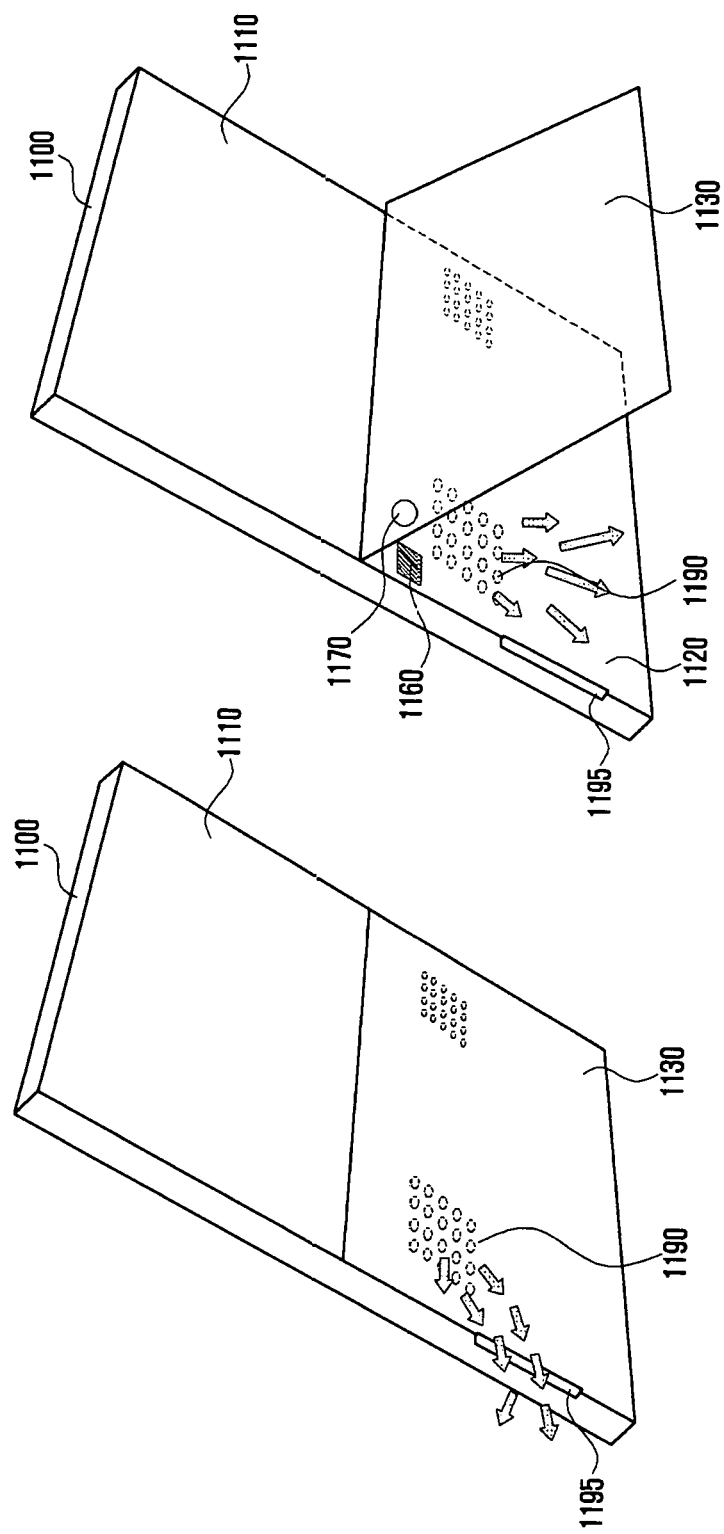
FIG. 11 is a diagram illustrating an operation of an electronic device according to various embodiments of the present invention.

FIG. 11 is a diagram illustrating an operation of an electronic device according to various embodiments of the present invention.

According to an embodiment, a rear surface of an electronic device 1100 may include a first area 1110 and a second area 1120. The electronic device 1100 may include a support structure 1130 having one end connected at a boundary of the first area 1110 and the second area 1120 and that covers or exposes the second area 1120 by rotating in one direction. The second area 1120 of the rear surface of the electronic device 1100 may include at least one vent hole 1190. When the support structure is open, the vent hole 1190 may toe exposed to the outside, and when the support structure 1130 is closed, the vent hole 1190 may be hidden by the support structure 1130. According to an embodiment, at a side surface of the electronic device 1100, a groove 1195 may be formed. For example, the side groove 1195 of the electronic device 1100 may be used when the user applies a force to the support structure 1130 in order to rotate the support structure 1130. According to an embodiment, the side groove 1195 of the electronic device 1100 may perform a passage function of emitting a heat emitted through the vent hole 1190 of the electronic device 1100 to the outside of the electronic device 1100. According to an embodiment, the second area 1120 of the rear surface of the electronic device 1100 or the inner surface of the support structure 1130 may include an emission passage in which heat is emitted. For example, the second area 1120 of the rear surface of the electronic device 1100 or the inner surface of the support structure 1130 may include an engraving structure to be a path in which heat is emitted. For example, in a state in which the support structure 1130 of the electronic device 1100 is closed, heat emitted through the vent hole 1190 (e.g., wind emitted through the vent hole) may be emitted to the outside of the electronic device 1100 through the side groove 1195 via the emitting path formed in the engraving structure.

According to an embodiment, when the electronic device 1100 is supported by the support structure 1130, the electronic device 1100 may operate a fan therein. By driving the fan, the electronic device 1100 may emit heat thereof through the vent hole 1190.

According to an embodiment, when the electronic device 1100 is supported, a space may be formed between the second area 1120 of the rear surface of the electronic device 1100 and the support structure 1130. The electronic device 1100 may control an operation of the fan based on a size of the space formed at the rear surface. For example, the electronic device 1100 may control an operating speed of a cooler (e.g., a fan) based on a size of the space formed at the rear surface.

For example, when the electronic device 1100 emits an internal heat of the electronic device 1100 through the vent hole 1190 by driving the fan, the heat emitted through a space formed at the rear surface of the electronic device 1100 may be emitted to the side surface of the electronic device 1100. For example, when the space formed at the rear surface of the electronic device 1100 is small, by strongly or quickly driving the fan, the emitted heat may be reflected to the support structure 1130 of the opposite side to be again introduced to the inside of the electronic device 1100. Conversely, when the space formed at the rear surface of the electronic device 1100 is large, by strongly driving the fan, the emitted heat may be emitted quickly to the side surface of the electronic device 1100 along the support structure 1130. According to various embodiments, when the electronic device 1100 is supported by the support structure 1130, the electronic device 1100 may determine a size of a space formed by the second area 1120 of the rear surface thereof, a reference surface in which the electronic device is supported, and the support structure 1130 and adjust a driving speed and intensity of the fan according to the size of the formed space, thereby efficiently emitting heat therein to the outside. Further, when the electronic device 1100 is not supported, by enabling the support structure 1130 of the electronic device 1100 to cover the vent hole 1190 and heat to be emitted through a gap provided at the side surface, a user body (e.g., a user hand) is prevented from being directly exposed to heat emitted from the electronic device 1100 without damaging an external appearance of the electronic device 1100, thereby improving safety.

According to various embodiments of the present invention, an electronic device includes at least one sensor, a processor electrically connected to the at least one sensor, a memory electrically connected to the processor, and a support structure having one end connected to a boundary of a first area and a second area of a rear surface of the electronic device and configured to cover the second area in a closed state by rotating in one direction based on the one end and configured to support the electronic device in an open state. According to an embodiment, when executed, the memory stores instructions that enable the processor to detect that the support structure is open using the at least one sensor; to detect a movement of the electronic device using the at least one sensor in a state in which the support structure is open; to detect a slope to a reference surface of the electronic device using the at least one sensor, when the movement of the electronic device is less than a predetermined threshold value for a predetermined time or more; and to control an operation of the electronic device based on at least a portion of the slope.

According to an embodiment, the instructions may enable the processor to determine a size of a rear space of the electronic device formed by the second area, the support structure, and the reference surface based on at least a portion of the detected slope, and to control an operation of the electronic device according to a size of the formed rear space.

According to an embodiment, the electronic device may further include a speaker disposed in the second area. The instructions may enable the processor to adjust an output setting value of a sound output through the speaker according to a size of the rear space.

According to an embodiment, the electronic device may further include a microphone disposed in the second area. The instructions may enable the processor to obtain a sound of the rear space through the microphone, to analyze the obtained sound to determine whether noise has occurred in the sound output through the speaker, and to adjust an output setting value of the speaker, if noise has occurred.

According to an embodiment, the electronic device may further include an internal fan and at least one vent hole disposed in the second area and configured to emit a heat within the electronic device according to an operation of the fan. The instructions may enable the processor to adjust an operation speed of the fan according to a size of the rear space.

According to an embodiment, the electronic device may further include at least one light source disposed in the second area. When a movement of the electronic device is less than a predetermined threshold value for a predetermined time or more, the instructions may enable the processor to output light through the light source.

According to an embodiment, the at least one sensor may include a rear sensor disposed in the second area. The support structure may include a magnetic material disposed at a position corresponding to that of the rear sensor. The instructions may enable the processor to detect an intensity of a magnetic force occurring in the magnetic material using the rear sensor and to detect that the support structure is open based on the detected intensity of the magnetic force.

Figure 12:
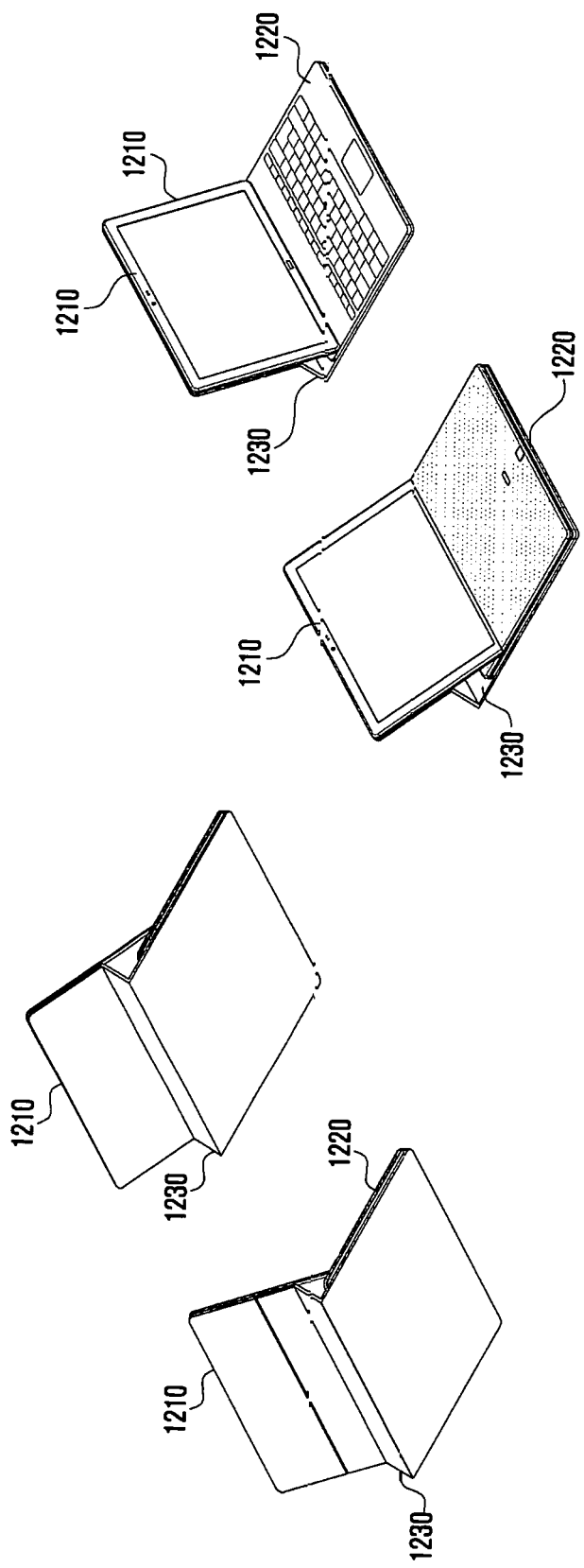
FIG. 12 is a diagram illustrating a structure of an electronic device according to various embodiments of the present invention.

FIG. 12 is a diagram illustrating a structure of an electronic device according to various embodiments of the present invention.

According to an embodiment, an electronic device 1210 may include a case 1230. The electronic device 1210 and the case 1230 may include an attachment magnet. The electronic device 1210 and the case 1230 may be detachably attached to each other using the attachment magnet. The case 1230 may include a plurality of hinges. The case 1230 may be folded in various forms using the plurality of hinges. For example, by folding the case 1230 in half based on an intermediate hinge disposed at an intermediate portion of the case 1230 in a state of being attached to the electronic device 1210, the case 1230 may cover a front portion and a rear portion of the electronic device 1210. According to an embodiment, the case 1230 may include a keyboard 1220 that can be connected to the electronic device 1210 by a wired or wireless means therein.

According to an embodiment, the rear surface of the electronic device 1210 may include a first area and a second area. According to an embodiment, the electronic device 1210 may include a near field communication antenna (NFC antenna).

In a closed state, the case 1230 may include a first cover that covers a front surface of the electronic device 1210, a second cover that covers the second area of the rear surface of the electronic device 1210, and a third cover that covers the first area of the rear surface of the electronic device 1210. According to an embodiment, at least a portion of the second cover may support the electronic device 1210 in a predetermined posture (e.g., a predetermined direction and a predetermined slope). For example, when the electronic device 1210 is supported by the case 1230, at least a portion of the second area of the rear surface of the electronic device 1210, at least a portion of the first cover of the case 1230, and at least a portion of the second cover of the case 1230 may form an empty space at the rear surface of the electronic device 1210.

According to an embodiment, the case 1230 may include a plurality of rear hinges in a portion corresponding to the rear surface of the electronic device 1210. For example, the second cover of the case 1230 may include a plurality of rear hinges. According to an embodiment, because the second cover of the case 1230 may be folded in various forms according to a plurality of rear hinges, at least a portion of the second cover may support the electronic device 1210 in various slopes. The electronic device 1210 may be supported in various slopes according to a folding structure of the case 1230.

Figure 13:
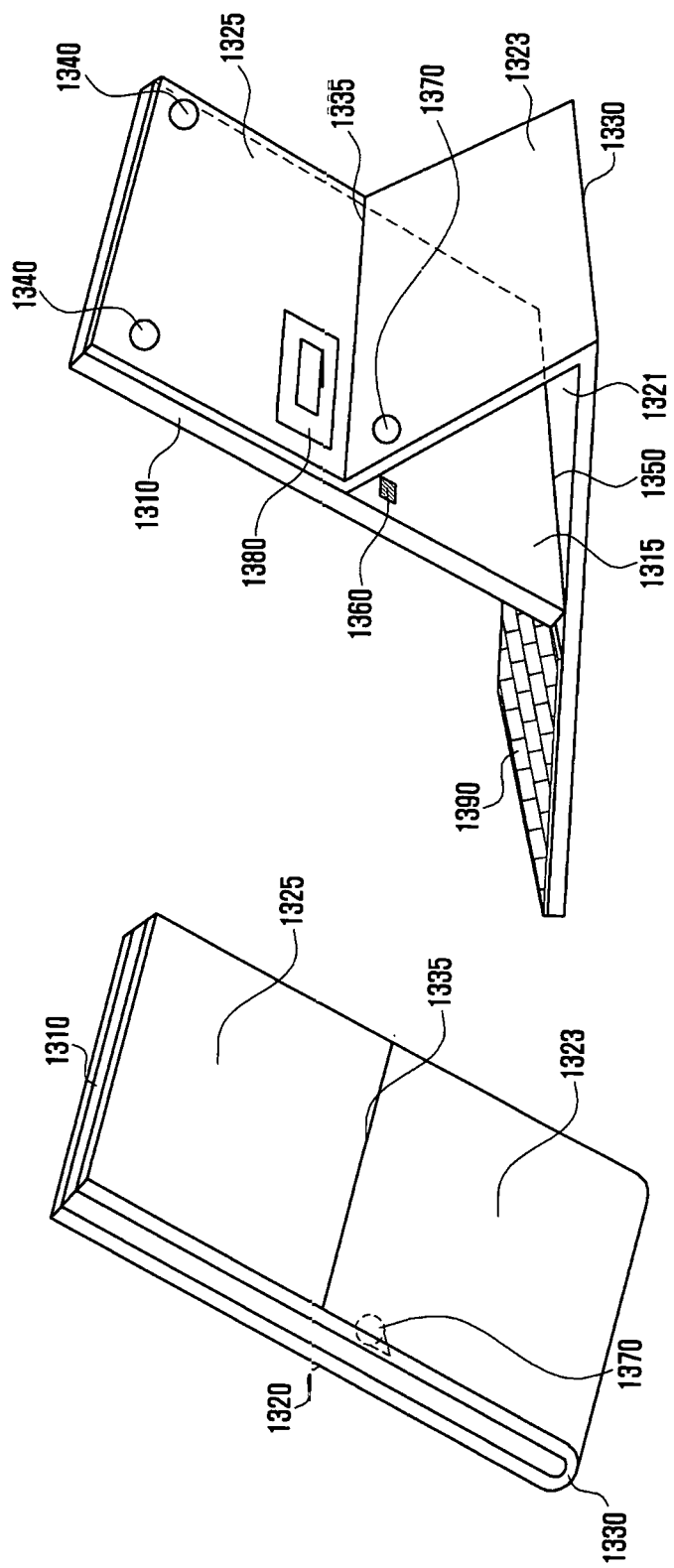
FIG. 13 is a perspective view illustrating an electronic device according to various embodiments of the present invention.

FIG. 13 is a perspective view illustrating an electronic device according to various embodiments of the present invention.

According to an embodiment, a rear surface of an electronic device 1310 may include a first area and a second area 1315. The electronic device 1310 may include a case 1320 having a plurality of hinges 1330 and 1335. The case 1320 may be folded in various forms using the plurality of hinges. According to an embodiment, by folding a central hinge 1330 disposed at the center of the case 1320, the case 1320 may enclose both the front surface and the rear surface of the electronic device 1310. The case 1320 may include at least one rear hinge 1335 in a portion corresponding to the rear surface of the electronic device 1310. In a closed state (a state of enclosing the front surface and the rear surface of the electronic device 1310 by folding the central hinge 1330), the case 1320 may include a first cover 1321 that covers a front surface of the electronic device 1310, a second cover 1323 that covers the second area 1315 of the rear surface of the electronic device 1310, and a third cover 1325 that covers the first area of the rear surface of the electronic device 1310. The first cover 1321 and the second cover 1323 may be divided by the intermediate hinge 1330, and the second cover 1323 and the third cover 1325 may be divided based on at least one rear hinge 1335.

With the case 1320, by folding the rear hinge 1335, at least a portion 1310 of the second cover 1323 may support the electronic device. For example, the first cover 1321 may be a reference surface in which the terminal is supported. At least a portion of the second cover 1323 may be separated from the second area 1315 of the rear surface of the electronic device 1310 to support the electronic device 1310 in a predetermined angle. The third cover 1325 may be attached to the first area of the rear surface of the electronic device 1310. For example, the third cover 1325 may be attached to the electronic device 1310 through an attachment magnet 1340.

According to an embodiment, the second area 1315 of the rear surface of the electronic device 1310 may include a rear sensor 1360 that detects whether the case 1320 (e.g., the second cover 1323 of the case 1320) is attached to or separated from the rear surface of the electronic device 1310. For example, the rear sensor 1360 may include a Hall sensor. For example, the rear sensor 1360 may include a well-known sensor that detects a magnetic force.

The case 1320 (e.g., the second cover of the case 1320) may include a magnetic material 1370 at a position corresponding to the rear sensor 1360 of the electronic device 1310. According to an embodiment, the rear sensor 1360 may sense a magnetic force emitted from the magnetic material 1370 of the case 1320 to detect that the case 1320 is separated from the rear surface of the electronic device 1310. For example, the rear sensor 1360 may generate a signal of different values according to a distance to the magnetic material 1370 included in the case 1320 and transfer the generated signal to the processor. The processor may determine whether the case 1320 has been attached to the second area 1315 of the rear surface of the electronic device 1310 based on at least a portion of a signal received from the rear sensor 1360.

According to various embodiments, the second area 1315 of the rear surface of the electronic device 1310 may include at least one of a speaker, woofer, vent hole, microphone, and light source. For example, the electronic device 1310 may detect when the electronic device 1310 is supported by the case 1320 to operate at least one element provided in the second area 1315 of the rear surface. For example, the electronic device 1310 may determine a size of a space formed by the second area 1315 of the rear surface and the case 1320 (e.g., at least a portion of the first covers 1321 and 1321 of the case 1320 and at least a portion of the second cover 1323) and control an operation of at least one element provided in the second area 1315 of the rear surface according to a size of the formed space.

According to various embodiments, the electronic device 1310 may include a connector (e.g., a POGO connector) that may be connected to an external device (e.g., the case 1320 or a keyboard 1390) at the lower end 1350. For example, when the case 1320 includes a keyboard 1390 at an inner surface, the connector of the lower end 1350 of the electronic device and a connector of the keyboard 1390 may be connected.

According to various embodiments, the electronic device 1310 may include a near field communication (NFC) module 1380. According to an embodiment, the case 1320 may include, for example, an NFC module 1380 in the first area or the second area of the rear surface thereof. According to an embodiment, the case 1320 may include an NFC module corresponding to the NFC module 1380 of the electronic device 1310. For example, when the NFC module 1380 is disposed at the rear surface of the electronic device 1310, the electronic device 1310 may detect whether the case 1320 is attached using a signal transmitted and received by the NFC module 1380 or may determine whether the electronic device is supported. According to various embodiments, the electronic device 1310 may include the NFC module 1380 at the side surface (e.g., a bezel portion of the electronic device 1310) or the front surface (e.g., an active area or a non-active area of the display). For example, when the NFC module 1380 is disposed at the front surface or the side surface of the electronic device 1310, the electronic device 1310 may detect an external device that supports NFC through the NFC module 1380 and be interworked with an external device. For example, the electronic device 1310 may detect a contact with an external device using the NFC module 1380 and perform various interworking operations (e.g., authentication, login, mirroring, data transmission and reception) with the external device.

Figure 14:
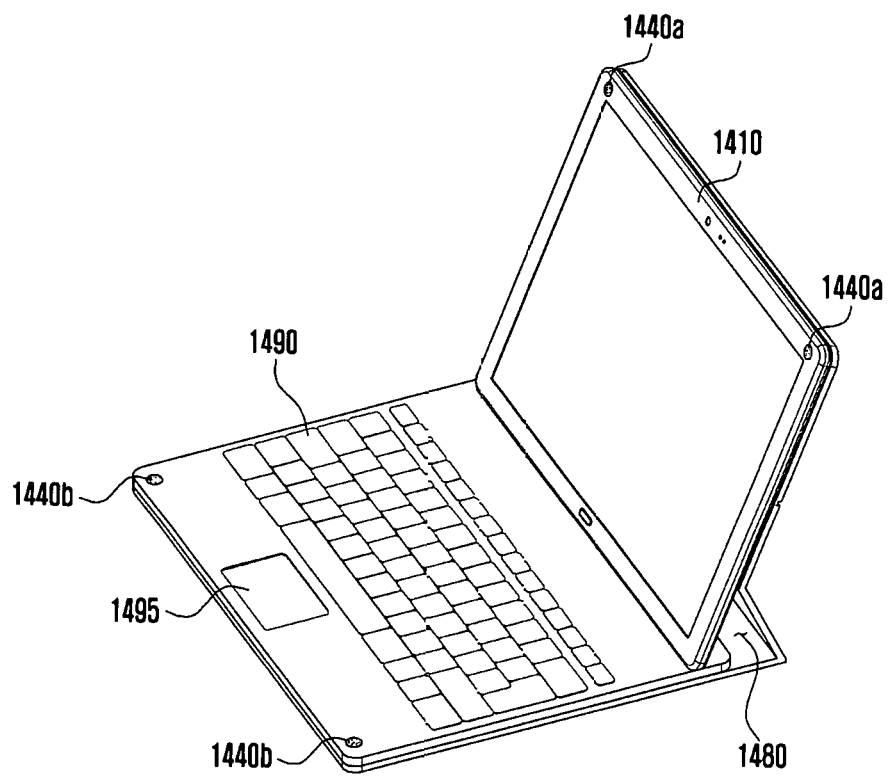
FIG. 14 is a perspective view illustrating an electronic device according to various embodiments of the present invention.

FIG. 14 is a perspective view illustrating an electronic device according to various embodiments of the present invention.

According to various embodiments, an electronic device 1410 may include a case. The electronic device 1410 may include a magnet 1440*a* formed detachably from the case in a front portion. The case may include a magnet 1440*b* formed detachably from the electronic device 1410 at a position corresponding to the magnet 1440*a* of the electronic device 1410.

According to an embodiment, the case may include a keyboard 1490 at an inner surface thereof. The keyboard 1490 may include a touchpad 1495. When the case is folded in half, the keyboard 1490 may be disposed at the inner surface of the case corresponding to the front portion of the electronic device 1410. The electronic device 1410 may include a connector (e.g., a POGO connector) that may be connected to an external device at the lower end. The electronic device 1410 may be connected to the keyboard 1490 of the case through the connector. According to an embodiment, the electronic device 1410 may be connected to the external device by a wired or wireless means. The electronic device 1410 may detect that the external device is connected; and, when the external device is connected, the electronic device 1410 may recognize a type of the external device.

According to an embodiment, when the electronic device 1410 is supported by the case, an empty space 1480 may be formed at the rear surface of the electronic device 1410 by at least a portion of the rear surface of the electronic device 1410 and at least a portion of the case that supports the electronic device 1410.

According to various embodiments, the electronic device 1410 may detect a slope to a reference surface thereof using a sensor and determine a size of the space 1480 formed at a rear surface thereof based on the detected slope. The electronic device 1410 may control a state or an operation thereof according to the size of the space 1480 formed at the rear surface.

Figure 15:
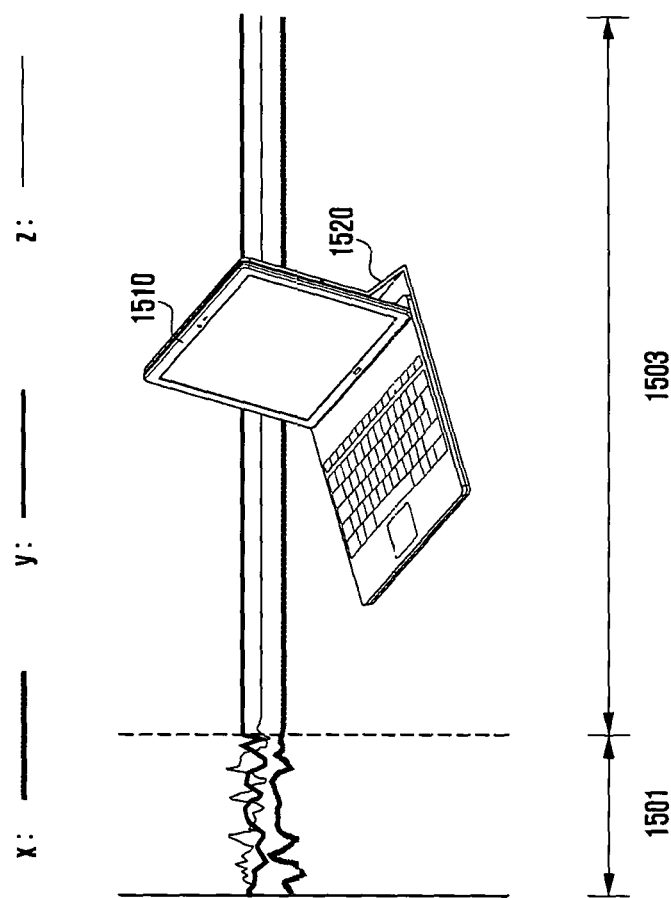
FIG. 15 is a diagram illustrating an operation of an electronic device according to various embodiments of the present invention.

FIG. 15 is a diagram illustrating an operation of an electronic device according to various embodiments of the present invention.

According to an embodiment, a rear surface of an electronic device 1510 may include a first area and a second area. According to an embodiment, the electronic device 1510 may include a case 1520. The case 1520 may be attached detachably from a main body. The case 1520 may have a form that covers a front surface and a rear surface of the electronic device 1510. For example, in a state in which the case 1520 is covering the electronic device 1510, the case 1520 may include a first cover that covers the front surface of the electronic device 1510, a second cover that covers the second area of the rear surface of the electronic device 1510, and a third cover that covers a first area of the rear surface of the electronic device 1510.

According to an embodiment, the electronic device 1510 may determine whether the electronic device 1510 is supported using at least one sensor. For example, the electronic device 1510 may determine whether the electronic device 1510 is supported using a gyro sensor or an acceleration sensor. For example, the electronic device 1510 may detect a state change value of the electronic device 1510 to three shafts using a sensor to determine a movement of the electronic device 1510. According to an embodiment, when the electronic device 1510 detects that the second cover of the case 1520 is separated from the second area of the rear surface of the electronic device 1510, the electronic device 1510 may detect a movement (e.g., a level of a direction and a movement of the electronic device 1510) of the electronic device 1510 using a sensor. For example, if a change width of a sensing value through the sensor is less than a predetermined threshold value for a predetermined time, the electronic device 1510 may determine that the electronic device 1510 is supported.

For example, a segment 1501 represents a state before the electronic device 1510 is supported. For example, when the user wants to support the electronic device 1510, the user may fold a hinge portion of the case 1520 or may move the electronic device 1510. In this case, a sensing value measured by the electronic device 1510 may have a shaking value instead of being fixed or may be relatively greatly fluctuated. For example, a segment 1503 represents a state in which the support of the electronic device 1510 has been complete. When the support of the electronic device 1510 has been complete, the electronic device 1510 may maintain a predetermined posture without a large movement. In this case, a sensing value measured by the electronic device 1510 may be maintained for a predetermined time or more without a large change. According to various embodiments, the electronic device 1510 may determine that the electronic device 1510 is supported based on a sensing value of a movement thereof and perform a specific function. For example, when the electronic device 1510 is supported, the electronic device 1510 may operate a speaker or a woofer included in the second area of the rear surface, emit light by operating a light source included in the second area of the rear surface, receive a sound through a microphone included in the second area of the rear surface, or emit heat through a vent hole included in the second area of the rear surface by operating a fan.

According to an embodiment, the electronic device 1510 may detect that an external electronic device 1510 is connected. The electronic device 1510 may determine a type of the connected external electronic device 1510. According to an embodiment, the electronic device 1510 may further detect whether the external device is connected to determine whether the electronic device 1510 is supported. For example, when a peripheral device (e.g., accessory devices such as a keyboard, a mouse, or a cover stand) is connected to the electronic device 1510, the electronic device 1510 may detect whether a portion (e.g., the second cover corresponding to the second area of the rear surface of the electronic device 1510) of the case 1520 is separated from the rear surface (e.g., the second area) thereof.

Figure 16:
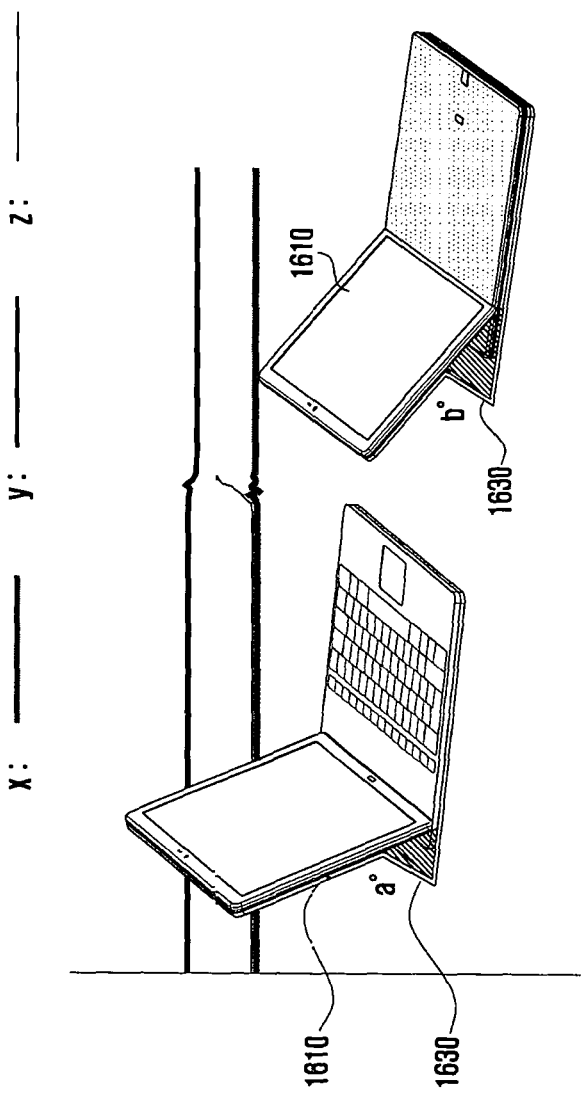
FIG. 16 is a diagram illustrating an operation of an electronic device according to various embodiments of the present invention.

FIG. 16 is a diagram illustrating an operation of an electronic device according to various embodiments of the present invention.

According to an embodiment, a case 1630 of an electronic device 1610 may include a plurality of hinges. For example, the case 1630 may be folded in various forms based on the plurality of hinges. According to an embodiment, the electronic device 1610 may be supported in various slopes according to a folding form of the attached case 1630.

According to an embodiment, the electronic device 1610 may control a state or operation thereof according to a support angle. Upon supporting the electronic device 1610, the electronic device 1610 may control a state or an operation thereof according to a size of a space formed between the second area of the rear surface thereof and the second cover of the case.

According to an embodiment, the electronic device 1610 may detect that a support angle thereof is changed. For example, when the electronic device 1610 detects that a portion (e.g., the second cover) of the case 1630 is separated from a portion (e.g., the second area of the rear surface thereof) of the rear surface of the electronic device 1610, the electronic device 1610 may detect a movement thereof using at least one sensor. For example, the electronic device 1610 may detect a state change thereof to three shafts using a gyro sensor or an acceleration sensor. When a change width of sensing values is maintained to less than a predetermined threshold value for a predetermined time or more, the electronic device 1610 may determine that the electronic device 1610 has been supported. When sensing values are changed to a predetermined threshold value or more, the electronic device 1610 may determine that a support angle thereof has been changed. For example, when the support angle of the electronic device 1610 has been changed, a direction of the electronic device 1610 may be changed or a movement level of the electronic device 1610 may increase. In this case, by detecting a change of the sensing values, the electronic device 1610 may determine that a support angle of the electronic device 1610 is changed. After the sensing values are changed, when a change width of the sensing value is again maintained to less than a predetermined threshold value for a predetermined time or more, the electronic device 1610 may determine that the electronic device 1610 has been again supported in a changed slope.

According to an embodiment, when the electronic device 1610 is supported, the electronic device 1610 may detect a slope to a reference surface (e.g., the first cover of the case 1630) thereof using the sensor. For example, the electronic device 1610 may determine a size of a space formed by the rear surface thereof, the first cover of the case 1630, and the second cover of the case 1630 based on the slope to the reference surface thereof. For example, the electronic device 1610 may already store information about a length of the width thereof and a length of the folding end of the second cover. The electronic device 1610 may determine a size of a space formed by the rear surface thereof, the second cover, and the third cover based on the stored information and the detected slope.

For example, when the electronic device 1610 is supported on the reference surface (e.g., the first cover of the case 1630), the electronic device 1610 may be supported in various angles according to a folding point of the second cover. In this case, an area of an isosceles triangle that the rear surface of the electronic device 1610, the second cover, and the reference surface (first cover) form at the side surface may be determined according to the folding point of the second cover. Accordingly, when the electronic device 1610 detects a slope thereof to the reference surface, the electronic device 1610 may calculate a size of a space formed by the second area of the rear surface thereof and the first cover and the second cover of the case 1630. For example, when an inclined angle of the electronic device 1610 to the reference surface gradually decreases, the size of the space formed by the second area of the rear surface of the electronic device 1610, the second cover, and the reference surface may gradually be reduced.

According to various embodiments, while performing a specific function (e.g., audio output, light output, and fan operation), the electronic device 1610 may control a performing operation according to a size of a space formed in the rear surface thereof. According to an embodiment, the electronic device 1610 may include a speaker in the second area of the rear surface. For example, the electronic device 1610 may control an output of the speaker according to the size of the space formed in the rear surface thereof. For example, the electronic device 1610 may change an output setting value of the speaker disposed in the second area of the rear surface based on at least a portion of the size of the space formed in the rear surface thereof. According to an embodiment, the electronic device 1610 may include at least one light source in the second area of the rear surface. For example, the electronic device 1610 may output light related to a current state thereof or contents displaying in a front display thereof using a light source. According to an embodiment, the electronic device 1610 may include a vent hole in the second area of the rear surface. The electronic device 1610 may operate the fan included therein to emit heat through the vent hole of the second area of the rear surface. The electronic device 1610 may control an operation (e.g., operation speed or intensity of the fan) of the fan according to a size of the space formed in the rear surface.

Figure 17:
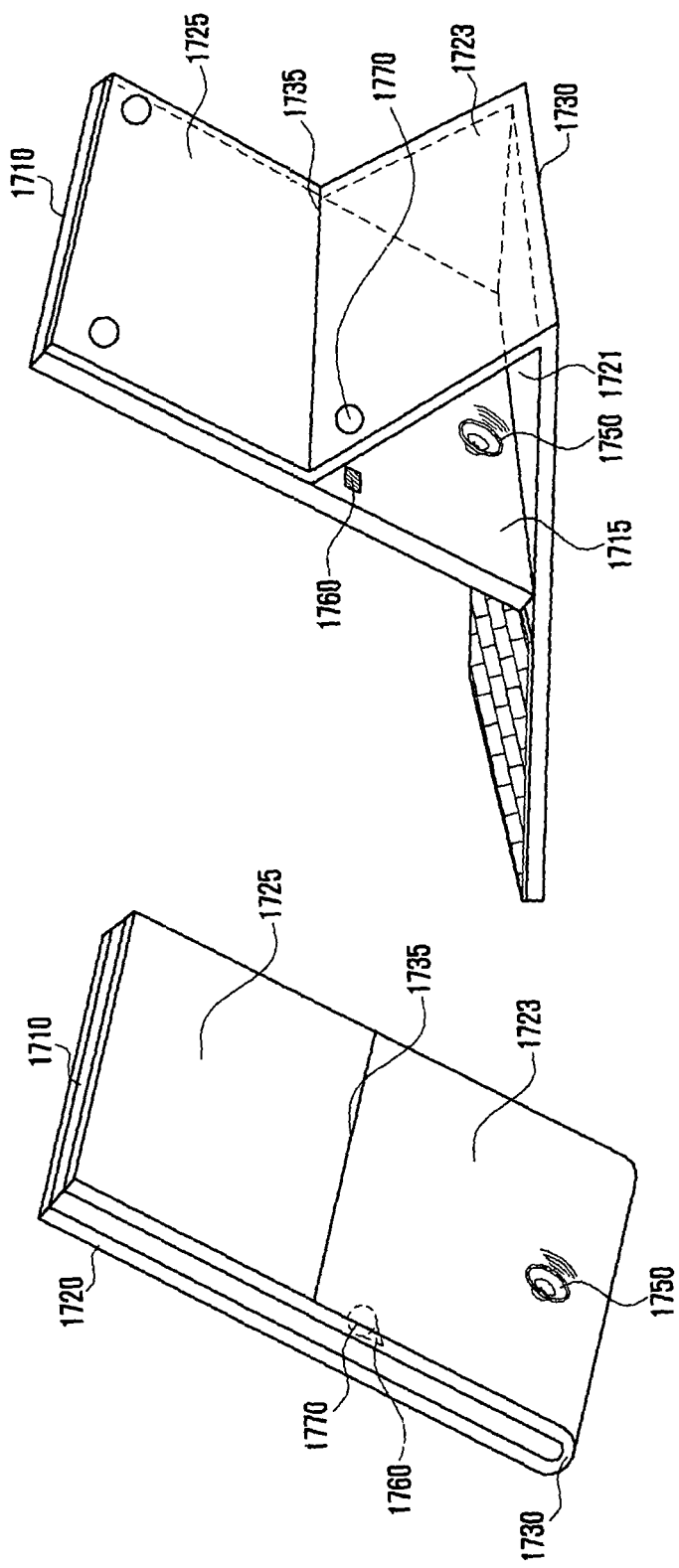
FIG. 17 is a diagram illustrating an operation of an electronic device according to various embodiments of the present invention.

FIG. 17 is a diagram illustrating an operation of an electronic device according to various embodiments of the present invention.

According to an embodiment, a rear surface of an electronic device 1710 may include a first area and a second area 1715. The electronic device 1710 may include a case 1720. The case 1720 may include a plurality of hinges (e.g., a central hinge 1730 and at least one rear hinge 1735). For example, the case 1720 may be folded in various forms based on the plurality of hinges 1730 and 1735. For example, the case 1720 may cover both a front surface and a rear surface of the electronic device 1710 in a state folded in half. The case 1720 may include a first cover 1721 that covers the front surface of the electronic device 1710, a second cover 1723 that covers the second area 1715 of the rear surface of the electronic device 1710, and a third cover 1725 that covers the first area of the rear surface of the electronic device 1710 in a state folded in half. According to various embodiments, the second cover 1723 may include at least one rear hinge 1735. According to various embodiments, when the second cover 1723 includes a plurality of rear hinges, the case 1720 may be folded in various forms or various angles based on the plurality of rear hinges. According to an embodiment, in a state in which at least a portion of the second cover 1723 is folded, the electronic device 1710 may be supported at a predetermined posture. According to an embodiment, the cases 1720 and 1720 may include a keyboard 1790 that may be connected to the electronic device 1710 at an inner surface of the first covers 1721 and 1721.

According to an embodiment, the second area 1715 of the rear surface of the electronic device 1710 may be exposed to the outside by folding of the case 1720. According to an embodiment, the second area 1715 may include a rear sensor 1760. The second cover 1723 of the case 1720 may include a magnetic material 1770 at a position corresponding to the rear sensor 1760. The electronic device 1710 may detect a magnetic force from the magnetic material 1770 using the rear sensor 1760 to determine whether the second cover 1723 is folded.

According to an embodiment, the second area 1715 of the rear surface of the electronic device 1710 may include a speaker 1750 or a woofer. For example, by folding the case 1720 of the electronic device 1710 according to a plurality of hinges 1730 and 1735, while the speaker 1750 of the rear surface of the electronic device 1710 is exposed, the case 1720 may support the electronic device 1710 with a predetermined posture.

According to an embodiment, when the electronic device 1710 is supported by the case 1720, a specific space may be formed in the rear surface of the electronic device 1710 by the second area 1715 of the rear surface of the electronic device 1710, the second cover 1723 of the case 1720, and the reference surface (e.g., the first cover 1721 of the case 1720). According to an embodiment, the electronic device 1710 may control an output of the speaker 1750 or the woofer according to the size of the space formed in the rear surface. For example, when the electronic device 1710 outputs a sound through the speaker 1750 of the second area 1715 of the rear surface, the space formed in the rear surface of the electronic device 1710 may be used as a resonance space of the sound. For example, the sound output to the rear surface of the electronic device 1710 may be reflected or overlapped to be amplified by the second area 1715 of the rear surface of the electronic device 1710 that forms a space at the rear surface of the electronic device 1710, the first cover 1721 of the case 1720, and the second cover 1723 of the case 1720. A boosting level of sounds output from the electronic device 1710 may be different according to the size of the space formed in the rear surface of the electronic device 1710. According to an embodiment, the electronic device 1710 may change an output of the speaker 1750 according to the size of the space formed at the rear surface to maximize a resonance effect of the sound. For example, the electronic device 1710 may change a gain value, an equalizer value, and a filter value of a sound according to a size of the space formed in the rear surface. According to various embodiments, output setting values of the sound according to a space formed in the rear surface may be preset or may be set or changed according to a user input.

According to an embodiment, the electronic device 1710 may include a microphone at a second space of the rear surface. The electronic device 1710 may receive a sound output through the speaker via a microphone. The electronic device 1710 may analyze the sound received via the microphone to determine whether noise, such as howling and buzzing, has occurred in the output sound. When noise has occurred in the output sound, in order to remove noise, the electronic device 1710 may change a setting value of the output sound.

When the electronic device 1710 according to various embodiments of the present invention is supported, by changing an output setting of a sound according to a size of a space formed by the case 1720 and the rear surface of the electronic device 1710, a more excellent sound effect may be provided to the user.

Figure 18:
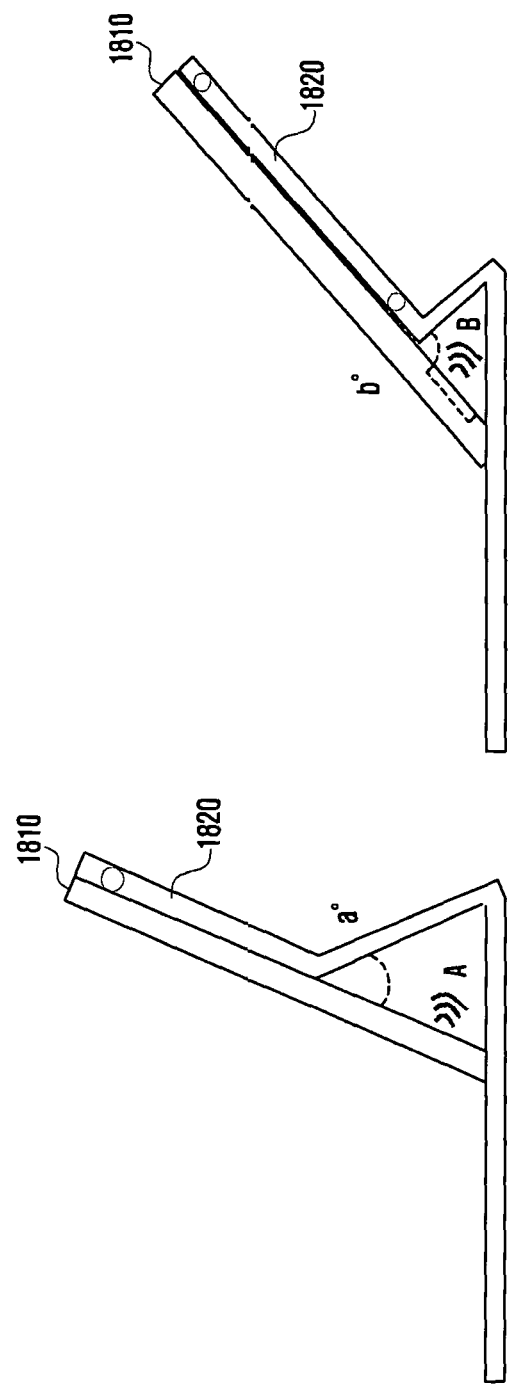
FIG. 18 is a side view illustrating an operation of an electronic device according to various embodiments of the present invention.

FIG. 18 is a side view illustrating an operation of an electronic device according to various embodiments of the present invention.

With reference to FIG. 18, an electronic device 1810 may be supported by a case 1820. For example, the electronic device 1810 may be supported in a specific angle according to a folding form of the case 1820. For example, when the electronic device 1810 is supported, a portion of the rear surface of the electronic device 1810 and a portion of the case 1820 may form an empty space at the rear surface of the electronic device 1810. According to various embodiments, a size of a space formed at the rear surface may be changed according to a folding form of the case 1820 and a slope of the electronic device 1810 according to the folding form.

According to various embodiments, the electronic device 1810 may control an operation thereof according to a size of a space formed at the rear surface. For example, when a speaker is included at the rear surface of the electronic device 1810, the electronic device 1810 may control an output of the speaker according to the size of the space formed at the rear surface.

According to an embodiment, the electronic device 1810 may include a vent hole for emitting heat to a portion of the rear surface. When the case is separated from the rear surface of the electronic device 1810 by folding a portion of the case 1820, the vent hole is exposed to the outside, and when the case 1820 is attached to the rear surface of the electronic device 1810, the vent hole may be hidden by the case 1820. According to an embodiment, when the electronic device 1810 is supported by the case 1820, the electronic device 1810 may operate an internal fan. The electronic device 1810 may drive a fan to emit heat thereof through the vent hole.

According to an embodiment, when a vent hole for emitting heat is included in the rear surface of the electronic device 1810, the electronic device 1810 may control an operation of the fan according to a size of a space formed in the rear surface to control an amount of heat emitted through the vent hole. For example, the electronic device 1810 may control an operating speed of a cooler (e.g., the fan) based on the size of the space formed in the rear surface. For example, when the electronic device 1810 operates the fan to emit internal heat of the electronic device 1810 through the vent hole, the heat emitted through a space formed at the rear surface of the electronic device 1810 may be emitted to a side surface of the electronic device 1810. For example, when the space formed in the rear surface of the electronic device 1810 is small, by strongly or quickly driving the fan, the emitted heat may be reflected by a support structure of the opposite side to be again introduced to the inside of the electronic device 1810. Conversely, when the space formed in the rear surface of the electronic device 1810 is large, by strongly driving the fan, the emitted heat may be quickly emitted to the side surface of the electronic device 1810 along the support structure.

According to various embodiments, when the electronic device 1810 is supported by a support structure, the electronic device 1810 may determine a size of a space formed by the support structure and the rear surface thereof and adjust a driving speed and intensity of the fan according to a size of the formed space to more efficiently emit an internal heat thereof to the outside.

FIG. 19 is a diagram illustrating an operation of an electronic device according to various embodiments of the present invention.

According to an embodiment, a rear surface of an electronic device 1910 may include a first area and a second area 1915 exposed according to folding of a case 1920. The second area 1915 of the rear surface of the electronic device 1910 may include at least one light source 1950. For example, the electronic device 1910 may include at least one light emitting diode (LED) in the second area 1915 of the rear surface. According to an embodiment, an inner surface of the case 1920 may include a reflector 1980 that reflects light emitted by the light source 1950 of the second area 1915 of the rear surface of the electronic device 1910. For example, the case 1920 may include a reflector 1980 at a position corresponding to the light source 1950 of the second area 1915 of the inner surface (a surface with which the electronic device 1910 contacts). For example, when the light source 1950 of the second area of the rear surface 1915 of the electronic device 1910 emits light, the emitted light may be reflected by the reflector 1980 of the case 1920 to be spread to the rear surface 1915 of the electronic device 1910.

According to an embodiment, the second area 1915 of the rear surface of the electronic device 1910 may be exposed to the outside by folding of the case 1920. According to an embodiment, the second area 1915 may include a rear sensor 1960. The case 1920 may include a magnetic material 1970 at a position corresponding to the rear sensor 1960. The electronic device 1910 may detect a magnetic force from the magnetic material 1970 using the rear sensor 1960 to determine whether a portion of the case 1920 is separated from the second area 1915 of the rear surface.

According to an embodiment, when the electronic device 1910 detects that a portion of the case 1920 is separated from the second area 1915 of the rear surface, the electronic device 1910 may operate the light source 1950 included in the second area 1915 of the rear surface. When the electronic device 1910 detects that the electronic device 1910 is supported by the case 1920, the electronic device 1910 may output light through the light source 1950 included in the second area 1915 of the rear surface.

According to various embodiments, the electronic device 1910 may change an emission form of light or a color of light emitted from the light source 1950 based on a support state, operation state, or performing operation of the electronic device 1910. For example, the electronic device 1910 may emit light in various patterns according to a performing function. According to an embodiment, the electronic device 1910 may emit light of various colors according to a state or a performing operation thereof and output light of a color related to contents displaying in a front display thereof. In another embodiment, the electronic device 1910 may output light of a color synchronized with an image displaying in the display. According to an embodiment, the electronic device 1910 may determine a size of a space formed at a rear surface thereof and emit light of various colors according to the size of the space formed at the rear surface. According to various embodiments, a color and pattern of light that the electronic device 1910 outputs according to a current state or function are not limited to the above case and may be variously set or changed according to a user input.

According to various embodiments of the present invention, by diffusing light to a periphery of the electronic device 1910 through a space formed at the rear surface, when the user uses the electronic device 1910, a sense of immersion increases and the user can more easily recognize a current state of the electronic device 1910 using light.

Figure 20:
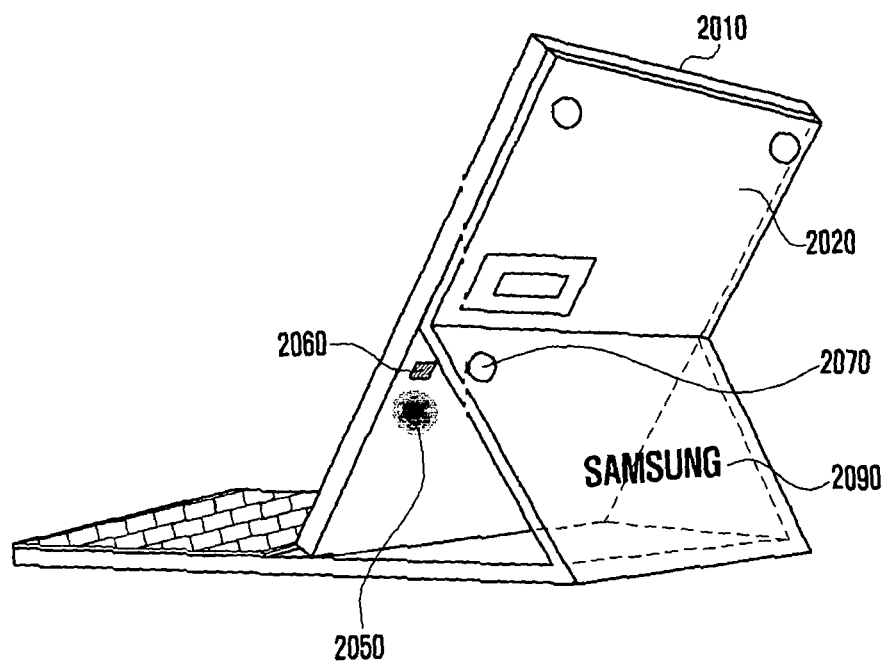
FIG. 20 is a diagram illustrating an operation of an electronic device according to various embodiments of the present invention.

FIG. 20 is a diagram illustrating an operation of an electronic device according to various embodiments of the present invention.

According to an embodiment, an electronic device 2010 may include a case 2020. The case 2020 may include a plurality of hinges and be folded in various forms based on the plurality of hinges. The case 2020 may support the electronic device 2010 in various slopes according to a folding form.

According to an embodiment, a portion of the rear surface of the electronic device 2010 may be exposed to the outside by folding of the case 2020. According to an embodiment, the electronic device 2010 may include a rear sensor 2060. The case 2020 may include a magnetic material 2070 at a position corresponding to the rear sensor 2060. The electronic device 2010 may detect a magnetic force from the magnetic material 2070 using the rear sensor 2060 to determine whether a portion of the case 2020 is separated from the rear surface of the electronic device 2010.

According to an embodiment, the rear surface of the electronic device 2010 may include a light source. For example, the electronic device 2010 may include at least one light source in an area in which the case 2020 is separated according to folding of the case 2020 at the rear surface. When at least a portion of the case 2020 is separated from the rear surface of the electronic device 2010 and the electronic device 2010 is supported by the case 2020 by folding of the case 2020, the electronic device 2010 may output light from the light source provided at the rear surface.

According to an embodiment, the case 2020 may include a particular form of a groove or a transparent (or translucent) portion. For example, the case 2020 may include a particular form of a groove or a transparent portion 2090 on a partial area separated from the electronic device 2010 to support the electronic device 2010. For example, the case 2020 may include a portion 2090 of a transparent material or a groove related to a brand name or a trade name of the product. For example, when the electronic device 2010 is supported, light emitted from the light source of an inner surface of the electronic device 2010 may to projected to the outside through the transparent portion 2090 or the groove of the case 2020.

An electronic device according to various embodiments of the present invention includes at least one sensor; a processor electrically connected to the at least one sensor; a memory electrically connected to the processor; and a case including a first cover corresponding to a front surface of the electronic device, a second cover corresponding to a second area of a rear surface of the electronic device, and a third cover corresponding to a first area of a rear surface of the electronic device and in which at least a portion of the second cover is separated from the second area while forming a predetermined angle from the second area to support the electronic device in a state in which the first cover is attached to the first area. When executed, the memory stores instructions that enable the processor to detect whether the second cover is attached to a second area of a rear surface of the electronic device; to detect a movement of the electronic device using the at least one sensor, when the second cover is separated from the electronic device; to detect a slope to a reference surface of the electronic device using the at least one sensor, when a movement of the electronic device is less than a predetermined reference value for a predetermined time or more; and to control an operation of the electronic device based on at least a portion of the slope.

According to an embodiment, the instructions enable the processor to determine a size of a rear space of the electronic device formed by the first cover, the second cover, and the second area based on at least a portion of the detected slope, and to control an operation of the electronic device according to the size of the formed rear space.

According to an embodiment, the electronic device may further include a speaker disposed in the second area, and wherein the instructions enable the processor to adjust an output setting value of a sound output through the speaker according to the size of the rear space.

According to an embodiment, the electronic device may further include an internal fan and at least one vent hole disposed in the second area and configured to emit heat within the electronic device according to an operation of the fan. The instructions enable the processor to adjust an operation speed of the fan according to a size of the rear space.

According to an embodiment, the electronic device may further include at least one light source disposed in the second area. When a movement of the electronic device is less than a predetermined threshold value for a predetermined time or more, the instructions enable the processor to output light through the light source.

Figure 21:
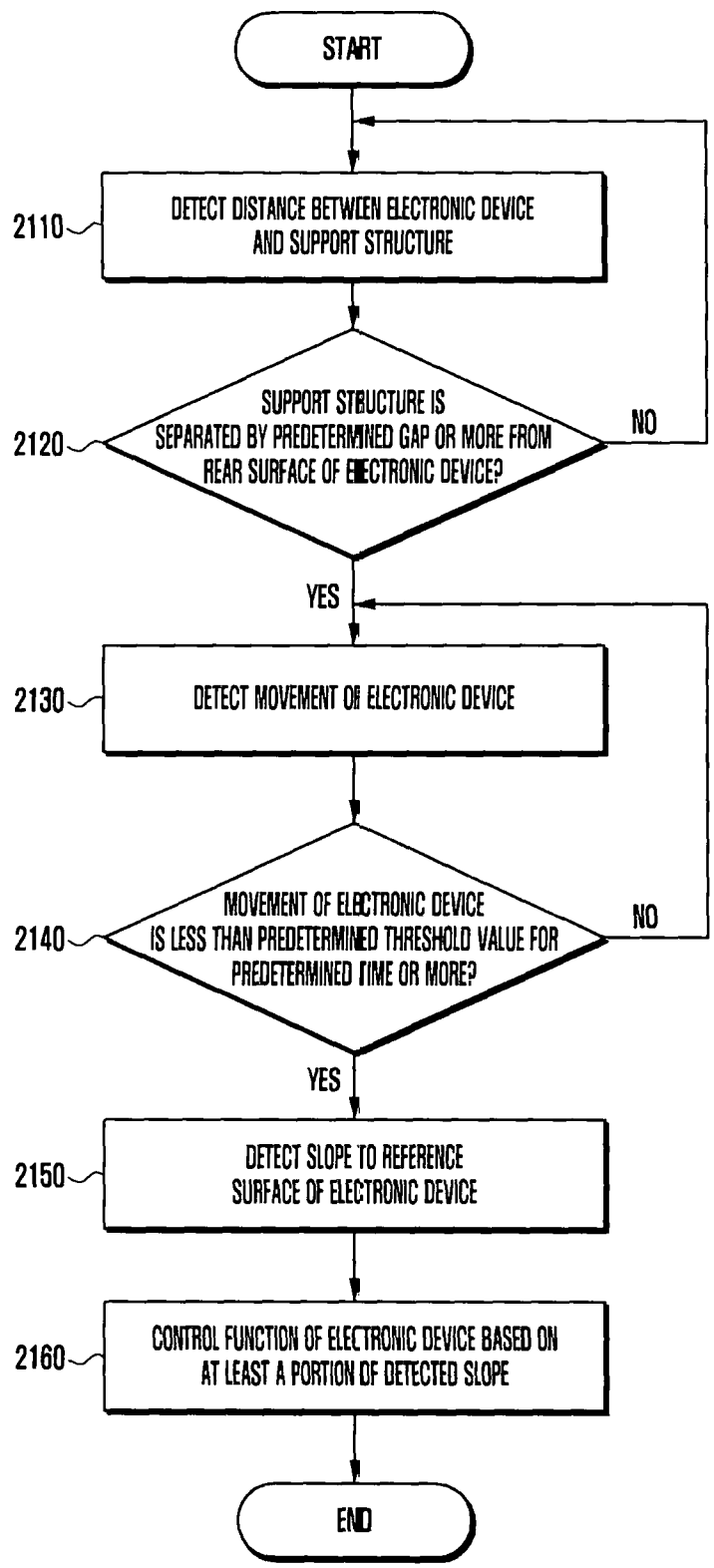
FIG. 21 is a flowchart illustrating a method of controlling an operation of an electronic device according to various embodiments of the present invention.

FIG. 21 is a flowchart illustrating a method of controlling an operation of an electronic device according to various embodiments of the present invention.

At operation 2110, the electronic device may detect a distance between the electronic device and a support structure. For example, the electronic device may detect a distance between a rear surface thereof and a support structure for supporting the same. According to an embodiment, the electronic device may include a rear sensor at the rear surface. The support structure may include a magnetic material at a position corresponding to the rear sensor. The electronic device may detect a magnetic force occurring in a magnetic material of the support structure using the rear sensor and detect a distance between the rear surface thereof and the support structure based on the detected magnetic force.

According to an embodiment, the support structure may be integrally formed with the electronic device. For example, the support structure may have one end connected to the rear surface of the electronic device, and the support structure may be opened and closed by rotating in one direction using the connected end as a shaft. According to another embodiment, the support structure may be a portion of a case attached to the electronic device. For example, the support structure may be a portion of the case and be a portion to be folded along a hinge of the case. For example, when the case is attached to the electronic device, a portion of the case may maintain a state attached to the upper end of the rear surface of the electronic device, a portion (e.g., a support structure) corresponding to the lower end of the rear surface of the electronic device may be folded in an opposite direction while maintaining a predetermined angle from the electronic device, and a portion corresponding to a front surface of the electronic device may form a reference surface for supporting the electronic device and the support structure.

At operation 2120, the electronic device may determine whether the support structure is separated by a predetermined gap or more from the rear surface thereof. For example, in a state in which the support structure is attached to the electronic device, the support structure may not support the electronic device. In order for the support structure to support the electronic device, while the support structure is separated from the rear surface while maintaining a predetermined angle from the rear surface of the electronic device, it is necessary for the lower end of the electronic device and the lower end of the support structure to exist on the same reference surface. Accordingly, in order to determine whether the electronic device is supported, the electronic device may determine whether the support structure is separated by a predetermined gap or more from the rear surface thereof. If the support structure is separated by a predetermined gap or more from the rear surface of the electronic device, the electronic device may perform operation 2130. If the support structure is not separated by a predetermined gap or more from the rear surface of the electronic device, for example, if the support structure is attached to the rear surface of the electronic device, the electronic device may perform operation 2110.

At operation 2130, the electronic device may detect a movement thereof. For example, the electronic device may detect a movement thereof using at least one sensor (e.g., a gyro sensor or an acceleration sensor).

At operation 2140, the electronic device may determine whether a movement thereof is less than a predetermined threshold value for a predetermined time or more. For example, when the user wants to support the electronic device, the electronic device may move. In this case, a sensing value measured by the electronic device may have a shaking value instead of being fixed or may fluctuate relatively greatly. For example, when the support of the electronic device is complete, the electronic device may maintain a predetermined posture without a large movement. In this case, a sensing value measured by the electronic device may be maintained without a large change for a predetermined time or more. According to various embodiments, the electronic device may determine whether the electronic device is supported based on the sensing value of the movement thereof. For example, if a movement of the electronic device is less than a predetermined threshold value for a predetermined time or more, the electronic device may determine that the electronic device is supported by the support structure. If a movement of the electronic device is less than a predetermined threshold value for a predetermined time or more, the electronic device may perform operation 2150. If a movement of the electronic device is a predetermined threshold value or more for a predetermined time or more, the electronic device may perform operation 2130.

At operation 2150, the electronic device may detect a slope to a reference surface thereof. For example, when the electronic device is supported in a predetermined posture (e.g., a predetermined direction and angle) on the reference surface, the electronic device may detect a sloe thereof to the reference surface.

At operation 2160, the electronic device may control a function thereof based on at least a portion of the detected slope. For example, the electronic device may operate a speaker or a woofer included in a rear surface thereof, emit light by operating a light source included in the rear surface, receive a sound through a microphone included in the rear surface, or emit heat generated therein through a vent hole included in the rear surface by operating an inner fan.

According to an embodiment, the electronic device may determine a size of an empty space that the electronic device, the support structure, and the reference surface form at the rear surface of the electronic device based on at least a portion of the detected slope. For example, the electronic device may control a function thereof according to a size of a space formed at the rear surface thereof. For example, the electronic device may change a setting value of the speaker, output a light source, change a color or an output pattern of the light source, or change an operating speed of an internal fan according to a size of a space formed at the rear surface thereof. For example, the electronic device may use the space formed at the rear surface as a resonance space of a sound output through a speaker. For example, the electronic device may adjust a setting value (e.g., a filter value, an equalization value) of the speaker according to a size of the formed space to provide a more abundant and three-dimensional sound to the user. According to another embodiment, when a size of a space formed at the rear surface increases, the electronic device may increase an operating speed of the internal fan. Accordingly, the electronic device can more efficiently emit heat generated therein through a vent hole disposed at a rear surface thereof.

According to various embodiments of the present invention, a method of controlling an operation of an electronic device including a support structure includes detecting whether the support structure is separated by a predetermined gap or more from a rear surface of the electronic device; detecting, if the support structure is separated by a predetermined gap or more from a rear surface of the electronic device, a movement of the electronic device; detecting, when a movement of the electronic device is less than a predetermined threshold value for a predetermined time or more, a slope to a reference surface of the electronic device; and controlling a function of the electronic device based on at least a portion f the slope.

According to an embodiment, the support structure may be formed integrally with the electronic device.

According to an embodiment, the support structure may be a portion of a case attached to the electronic device.

According to an embodiment, controlling a function of the electronic device may include determining a size of a rear space of the electronic device formed by the electronic device, the support structure, and the reference surface based on at least a portion of the detected slope and controlling a function of the electronic device according to the size of the formed rear space.

According to an embodiment, controlling a function of the electronic device may include adjusting an output setting value of a sound outputting through a speaker disposed at a rear surface of the electronic device according to the size of the rear space.

According to an embodiment, controlling a function of the electronic device may include obtaining a sound from the rear space using a microphone; analyzing the obtained sound to determine whether noise has occurred in the sound output through the speaker; and readjusting, if noise has occurred, an output setting value of the sound outputting through the speaker.

According to an embodiment, controlling a function of the electronic device may include adjusting an operating speed of an internal fan of the electronic device according to the size of the rear space.

According to an embodiment, when a movement of the electronic device is less than a predetermined threshold value for a predetermined time or more, the method may further include outputting light through a light source disposed at a rear surface of the electronic device.

A term "module" used in this document includes a unit configured with hardware, software, or firmware and may be interchangeably used with a term such as logic, logic block, component, or circuit. The "module" may be an integrally configured component or a minimum unit that performs at least one function or a portion thereof. The "module" may be implemented mechanically or electronically and may include, for example, an application-specific integrated circuit (ASIC) chip, field-programmable gate arrays (FPGAs), and a programmable logic device that performs any operation, and any similar such device that is known or is to be developed in the future. At least a portion of a device (e.g., modules or functions thereof) or a method (e.g., operations) according to various embodiments may be implemented with an instruction stored at a computer readable storage medium (e.g., the memory 130) in a form of a program module. When the instruction is executed by a processor (e.g., the processor 120), the processor may perform a function corresponding to the instruction. A computer readable recording medium may include a hard disk, floppy disk, magnetic medium (e.g., magnetic tape), optical recording medium (e.g., CD-ROM, DVD), magnetic-optical medium (e.g., floptical disk), and internal memory. The instruction may include a code made by a compiler or a code that may be executed by an interpreter. A module or a programming module according to various embodiments may include at least one of the foregoing elements, may omit some elements, or may further include another element. According to various embodiments, operations performed by a module, a program module, or another constituent element may be sequentially, parallelly, repeatedly, or heuristically executed and at least some operations may be executed in a different order or omitted, or another operation may be added.

The invention claimed is:

1. An electronic device, comprising:
   at least one sensor;
   a processor electrically connected to the at least one sensor;
   a memory electrically connected to the processor;
   a support structure having one end connected to a boundary of a first area and a second area of a rear surface of the electronic device configured to cover the second area in a closed state by rotating in one direction based on the one end and configured to support the electronic device in an open state; and
   a speaker disposed in the second area,
   wherein, when executed, the memory stores instructions that enable the processor to:
      detect that the support structure is open using the at least one sensor;
      detect a movement of the electronic device using the at least one sensor in a state in which the support structure is open;
      determine a size of a rear space of the electronic device using the at least one sensor when the movement of the electronic device is less than a predetermined movement threshold value for a predetermined time or more, wherein the rear space of the electronic device is a triangle formed by the second area, the support structure, and a reference surface on which the electronic device is supported; and
      control an operation of the electronic device based on the size of the rear space, wherein the operation comprises adjusting an output setting value of a sound output through the speaker based on the size of the rear space.

2. The electronic device of claim 1, wherein the instructions enable the processor to:
   detect a slope to the reference surface using the at least one sensor; and
   determine the size of the rear space based on at least a portion of the detected slope.

3. The electronic device of claim 1, further comprising a microphone disposed in the second area,
   wherein the instructions enable the processor to:
      obtain a sound of the rear space through the microphone;
      analyze the obtained sound to determine whether a noise has occurred in the sound output through the speaker; and
      to adjust the output setting value of the speaker, if the noise has occurred.

4. The electronic device of claim 2, further comprising:
   an internal fan; and
   at least one vent hole disposed in the second area and configured to emit heat within the electronic device according to an operation of the internal fan,
   wherein the instructions enable the processor to adjust an operation speed of the internal fan according to the size of the rear space.

5. The electronic device of claim 1, further comprising at least one light source disposed in the second area,
   wherein the instructions enable the processor to output light through the light source, when the movement of the electronic device is less than the predetermined movement threshold value for the predetermined time or more.

6. The electronic device of claim 1, wherein the at least one sensor comprises a rear sensor disposed in the second area,
wherein the support structure comprises a magnetic material disposed at a position corresponding to that of the rear sensor, and
wherein the instructions enable the processor to:
detect an intensity of a magnetic force occurring in the magnetic material using the rear sensor; and
detect that the support structure is opened based on the detected intensity of the magnetic force.

7. An electronic device, comprising:
at least one sensor;
a processor electrically connected to the at least one sensor;
a memory electrically connected to the processor;
a case comprising a first cover corresponding to a front surface of the electronic device, a second cover corresponding to a second area of a rear surface of the electronic device, and a third cover corresponding to a first area of the rear surface of the electronic device and in which at least a portion of the second cover is separated from the second area while forming a predetermined angle from the second area to support the electronic device in a state in which the first cover is attached to the first area; and
a speaker disposed in the second area,
wherein, when executed, the memory stores instructions that enable the processor to:
detect whether the second cover is attached to the second area of the rear surface of the electronic device;
detect a movement of the electronic device using the at least one sensor, when the second cover is separated from the electronic device;
determine a size of a rear space of the electronic device formed by a reference surface of the first cover, the second cover, and the second area using the at least one sensor when the movement of the electronic device is less than a predetermined movement reference value for a predetermined time or more; and
control an operation of the electronic device based on the size of the rear space, wherein the operation comprises adjusting an output setting value of a sound output through the speaker based on the size of the rear space.

8. The electronic device of claim 7, wherein the instructions enable the processor to:
detect a slope to the reference surface using the at least one sensor; and
determine the size of the rear space of the electronic device based on at least a portion of the detected slope.

9. The electronic device of claim 8, further comprising:
an internal fan; and
at least one vent hole disposed in the second area and configured to emit heat within the electronic device according to an operation of the internal fan,
wherein the instructions enable the processor to adjust an operation speed of the internal fan according to the size of the rear space.

10. The electronic device of claim 7, further comprising at least one light source disposed in the second area,
wherein the instructions enable the processor to output light through the light source, when the movement of the electronic device is less than the predetermined movement reference value for the predetermined time or more.

11. A method of controlling an operation of an electronic device comprising a support structure, the method comprising:
detecting whether the support structure is separated by a predetermined gap or more from a rear surface of the electronic device;
detecting, if the support structure is separated by the predetermined gap or more from the rear surface of the electronic device, a movement of the electronic device;
determining a size of a rear space of the electronic device when the movement of the electronic device is less than a predetermined movement threshold value for a predetermined time or more, wherein the rear space of the electronic device is a triangle formed by the rear surface of the electronic device, the support structure, and a reference surface on which the electronic device is supported; and
controlling a function of the electronic device based on the size of the rear space, wherein the function comprises adjusting an output setting value of a sound output through a speaker disposed at the rear surface of the electronic device based on the size of the rear space.

12. The method of claim 11, wherein the support structure is formed integrally with the electronic device.

13. The method of claim 11, wherein the support structure is a portion of a case attached to the electronic device.

14. The method of claim 11, wherein controlling the function of the electronic device comprises:
detecting a slope to the reference surface; and
determining the size of the rear space based on at least a portion of the detected slope.

15. The method of claim 11, wherein controlling the function of the electronic device comprises:
obtaining the sound from the rear space using a microphone;
analyzing the obtained sound to determine whether a noise has occurred in the sound outputting through the speaker; and
readjusting, if the noise has occurred, the output setting value of the sound outputting through the speaker.

16. The method of claim 14, wherein controlling the function of the electronic device comprises adjusting an operating speed of an internal fan of the electronic device according to the size of the rear space.

17. The method of claim 14, further comprising outputting, when the movement of the electronic device is less than the predetermined movement threshold value for the predetermined time or more, light through a light source disposed at the rear surface of the electronic device.

* * * * *